United States Patent
Won et al.

(10) Patent No.: US 10,430,546 B2
(45) Date of Patent: Oct. 1, 2019

(54) INTEGRATED CIRCUIT, AND COMPUTING SYSTEM AND COMPUTER-IMPLEMENTED METHOD FOR DESIGNING INTEGRATED CIRCUIT

(71) Applicant: SAMSUNG ELECTRONICS CO., LTD., Suwon-si, Gyeonggi-do (KR)

(72) Inventors: Hyo-Sig Won, Suwon-si (KR); Myung-Soo Jang, Seoul (KR); Hyoun-Soo Park, Seoul (KR); Da-Yeon Cho, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 53 days.

(21) Appl. No.: 15/802,657

(22) Filed: Nov. 3, 2017

(65) Prior Publication Data
US 2018/0173838 A1 Jun. 21, 2018

(30) Foreign Application Priority Data
Dec. 16, 2016 (KR) .......................... 10-2016-0172893

(51) Int. Cl.
*G06F 17/50* (2006.01)
*G03F 7/20* (2006.01)
*G03F 1/70* (2012.01)

(52) U.S. Cl.
CPC ............ *G06F 17/5081* (2013.01); *G03F 1/70* (2013.01); *G03F 7/70433* (2013.01); *G03F 7/70466* (2013.01); *G06F 17/5072* (2013.01)

(58) Field of Classification Search
CPC .......................... G06F 15/5081; G03F 7/70433
USPC .................................................... 716/54, 55
See application file for complete search history.

(56) References Cited

U.S. PATENT DOCUMENTS

| | | |
|---|---|---|
| 8,219,939 B2 | 7/2012 | Schultz et al. |
| 8,484,607 B1 | 7/2013 | Tang et al. |
| 8,516,403 B2 | 8/2013 | Abou Ghaida et al. |
| | (Continued) | |

OTHER PUBLICATIONS

Yu et al.,"Layout Decomposition for Triple Patterning Lithography", Nov. 2011, IEE/ACM International Conference on Computer-Aided Design (ICCAD), pp. 1-8.*

(Continued)

*Primary Examiner* — Sun J Lin
(74) *Attorney, Agent, or Firm* — F. Chau & Associates, LLC

(57) ABSTRACT

A computer-implemented method compresses placing standard cells based on design data defining an integrated circuit (IC). A layout of the IC is generated by performing colorless routing, by which a first pattern, a second pattern, and a third pattern in a triple patterning lithography (TPL) layer are arranged on the placed standard cells. The arrangement is based on space constraints. The generated layout is stored to a non-transitory computer-readable storage medium. The space constraints define minimum spaces between the first pattern, the second pattern, and the third pattern. A color violation does not occur between the first pattern, second pattern, and the third pattern. A first mask, a second mask, and a third mask are generated based on the layout. A semiconductor device is manufactured by using the generated first mask, the second mask, and the third mask.

20 Claims, 24 Drawing Sheets

(56) References Cited

U.S. PATENT DOCUMENTS

| | | | |
|---|---|---|---|
| 8,707,223 B2* | 4/2014 | Blatchford | G06F 17/5077 716/55 |
| 8,782,570 B1 | 7/2014 | Li et al. | |
| 8,910,095 B2* | 12/2014 | Li et al. | G06F 17/50 716/51 |
| 8,935,639 B1* | 1/2015 | Tzeng | G06F 17/5077 430/30 |
| 8,954,913 B1* | 2/2015 | Yuan et al. | G06F 17/5068 716/126 |
| 9,026,971 B1 | 5/2015 | Ho et al. | |
| 9,029,230 B2 | 5/2015 | Xiao et al. | |
| 9,141,752 B2 | 9/2015 | Lin et al. | |
| 9,158,885 B1* | 10/2015 | Gray et al. | G03F 7/70433 |
| 9,659,141 B2* | 5/2017 | Lin et al. | G06F 17/5081 |
| 2013/0001185 A1 | 3/2013 | Abou Ghaida et al. | |
| 2014/0077380 A1* | 3/2014 | Kim et al. | H01L 23/5386 257/773 |
| 2014/0245237 A1* | 8/2014 | Cilingir et al. | G03F 7/70433 716/51 |
| 2015/0089457 A1 | 3/2015 | Agarwal et al. | |
| 2015/0302129 A1 | 10/2015 | Chen et al. | |
| 2016/0063169 A1 | 3/2016 | Tsai et al. | |
| 2016/0098509 A1* | 4/2016 | Seo et al. | G06F 17/5072 716/55 |
| 2017/0147740 A1* | 5/2017 | Chang | G06F 17/5081 |
| 2018/0173835 A1* | 6/2018 | Do et al. | G06F 17/5072 |
| 2018/0173837 A1* | 6/2018 | Won et al. | G03F 1/68 |

OTHER PUBLICATIONS

Qiang Ma, et al., "Triple Patterning Aware Routing and its Comparison with Double Patterning Aware Routing in 14nm Technology", DAC2012, Jun. 3-7, 2012, pp. 591-596.

Zhiging Liu, et al., "An Effective Triple Patterning Aware Grid-based Detailed Routing Approach", 2015 Design, Automation & Test in Europe Conference & Exhibition, 2015, pp. 1641-1646.

Po-Ya Hsu, et al., "Non-stitch Triple Patterning-Aware Routing Based on Conflict Graph Pre-coloring", 2015 IEEE, 2015, pp. 390-395.

* cited by examiner

| | DEFINITION |
|---|---|
| DS1 | diff. color space of S2S |
| DS2 | diff. color space of T2T |
| DS3 | diff. color space of T2S |
| DS4 | diff. color space of C2C |

INTEGRATED CIRCUIT, AND COMPUTING SYSTEM AND COMPUTER-IMPLEMENTED METHOD FOR DESIGNING INTEGRATED CIRCUIT

CROSS-REFERENCE TO RELATED APPLICATION

This application claims priority under 35 USC § 119 to Korean Patent Application No. 10-2016-0172893, filed on Dec. 16, 2016, in the Korean Intellectual Property Office, the disclosure of which is incorporated by reference herein in its entirety.

TECHNICAL FIELD

Exemplary embodiments of the present inventive concept relate to an integrated circuit, and to an integrated circuit for triple patterning lithography (TPL), a computing system and a computer-implemented method for designing the integrated circuit, a semiconductor device based on the integrated circuit, and a method of manufacturing the semiconductor device.

DISCUSSION OF THE RELATED ART

With developments in semiconductor process technologies, design rules of an integrated circuit may have become more complicated, and the need to reduce gaps between adjacent patterns may have grown. In consideration of a patterning resolution, a plurality of patterns included in a layer may be formed by using a plurality of masks rather than a single mask. A patterning technology using the plurality of masks may be referred to as a multi-patterning technology. For example, a patterning technology using three masks may be referred to as a triple patterning lithography (TPL). To apply the TPL, color decomposition whereby colors are assigned to the plurality of patterns may be performed.

SUMMARY

According to one or more exemplary embodiments of the present inventive concept, a computer-implemented method includes placing standard cells based on design data defining an integrated circuit. The method further includes generating a layout of the integrated circuit by performing colorless routing wherein first, second, and third patterns included in a triple patterning lithography (TPL) layer are arranged based on space constraints. The first, second, and third patterns are arranged on the placed standard cells. The method still further includes storing the generated layout to a computer-readable storage medium. The method still further includes generating first, second, and third masks based on the layout, and manufacturing a semiconductor device by using the generated first, second, and third masks. The space constraints define minimum spaces between the first, second, and third patterns. A color violation is determined based on the space constraints.

One or more exemplary embodiments of the present inventive concept include an integrated circuit including a layer. The layer includes first through third patterns. First through third colors are respectively assigned to the first through third patterns. The first and second patterns extend in a first direction and are adjacent to each other in a second direction. The second direction is perpendicular to the first direction. A space between the first and second patterns is substantially equal to or greater than a minimum side-to-side space between patterns to which different colors are assigned.

According to one or more exemplary embodiments of the present inventive concept, a computer-implemented method includes placing standard cells based on design data defining an integrated circuit. The method further includes generating a layout of the integrated circuit by performing colorless routing wherein first, second, and third patterns included in a triple patterning lithography (TPL) layer are arranged based on space constraints. The first, second, and third patterns are arranged on the placed standard cells. The method still further includes storing the generated layout to a computer-readable storage medium. The method still includes assigning first, second, and third colors, respectively, to the first, second, and third patterns. The space constraints define minimum spaces between two of the first, second, and third patterns. When a space between two of the first, second, and third patterns is less than a respective space constraint, a color violation is indicated. The method still further includes generating first, second, and third masks respectively corresponding to the first, second, and third colors based on the layout, and manufacturing a semiconductor device by using the generated first, second, and third masks.

BRIEF DESCRIPTION OF THE DRAWINGS

The above and other features of the inventive concept will be more apparent by describing in detail exemplary embodiments thereof, with reference to the accompanying drawings, which.

DETAILED DESCRIPTION OF THE EMBODIMENTS

Exemplary embodiments of the present inventive concept will be described more fully hereinafter with reference to the accompanying drawings. The present disclosure may, however, be embodied in many different forms and should not be construed as limited to the embodiments set forth herein.

Figure 1:
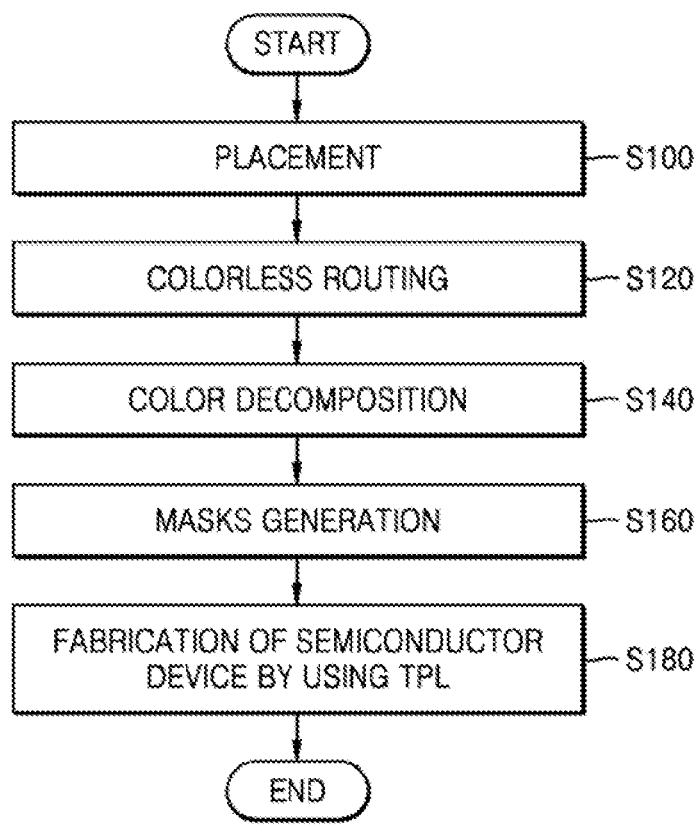
FIG. 1 is a flowchart of a method of manufacturing a semiconductor device according to an exemplary embodiment of the present inventive concept.

FIG. 1 is a flowchart of a method of manufacturing a semiconductor device 100b according to an exemplary embodiment of the present inventive concept. FIGS. 2A through 2D are views for describing triple patterning lithography (TPL) according to an exemplary embodiment of the present inventive concept. For example, FIGS. 2A through 2D may correspond to results of operations S120, S140, S160, and S180 of FIG. 1, respectively. Hereinafter, the method of manufacturing the semiconductor device 100b by using the TPL according to an exemplary embodiment of the present inventive concept will be described with reference to FIGS. 1 through 2D.

In operation S100, standard cells may be placed according to design data that defines an integrated circuit (hereinafter referred to as "design data"). Each of the standard cells may include active regions and gate lines, and may further include contacts and vias on the active regions and the gate lines. Also, each standard cell may further include a first wiring layer including metal patterns on the contacts.

In operation S120, a layout 100 of the integrated circuit may be generated by performing colorless routing with respect to the placed standard cells. The colorless routing may refer to an operation of generating the layout without performing color decomposition during a routing operation. According to an exemplary embodiment, first through third patterns 101 through 103 may be included in a TPL layer, and may be arranged on the placed standard cells according to space constraints. Here, the space constraints may define minimum spaces between the first through third patterns 101 through 103 such that a color violation does not occur between the first through third patterns 101 through 103. According to an exemplary embodiment of the present inventive concept, the TPL layer may be a second wiring layer arranged on the first wiring layer. According to an exemplary embodiment of the present inventive concept, a technology file may be corrected to include the space constraints in the technology file, so that the colorless routing may be performed by using a general placement & routing (P&R) tool.

Figure 2A:
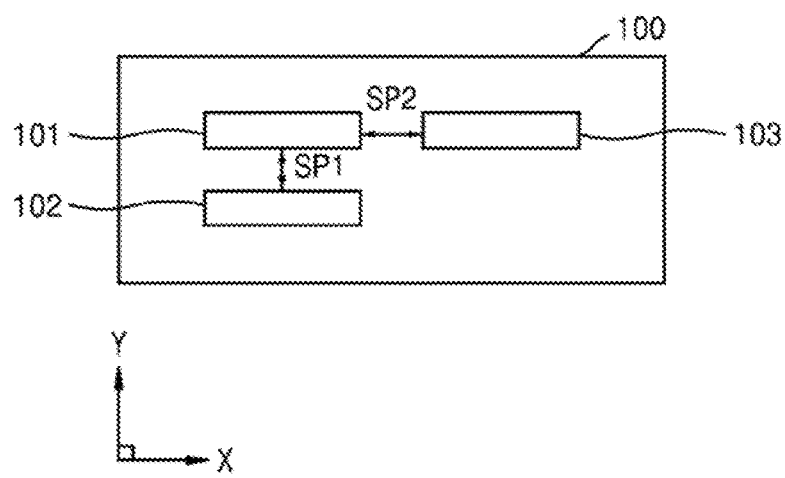
FIGS. 2A through 2D are views for describing triple patterning lithography (TPL) according to an exemplary embodiment of the present inventive concept.
Figure 2B:
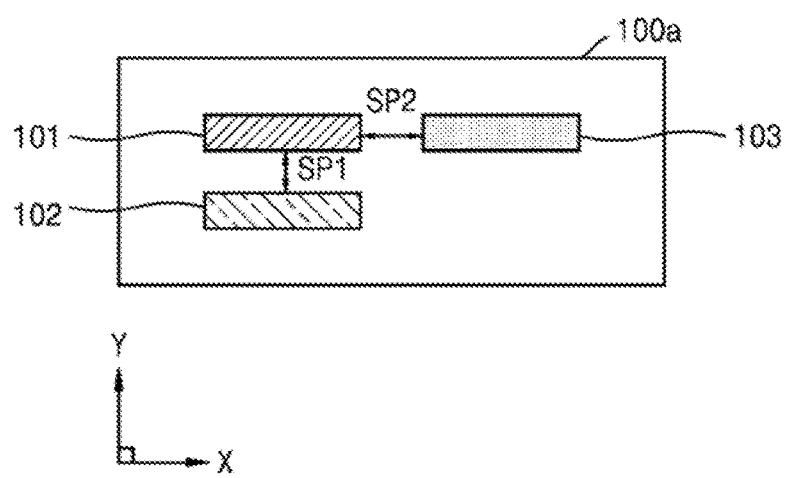

In FIG. 2A, the first through third patterns 101 through 103 may extend in a first direction (for example, a direction X). According to an exemplary embodiment of the present inventive concept, the first through third patterns 101 through 103 may be arranged such that a first space SP1 between the first and second patterns 101 and 102, and a second space SP2 between the first and third patterns 101 and 103 may satisfy space constraints. For example, the first space SP1 may be less than the second space SP2, but the present inventive concept may not be limited thereto.

In operation S140, the color decomposition that may assign first through third colors to the first through third patterns 101 through 103 included in the TPL layer may be performed, based on the generated layout. In one example, in the layout 100a of FIG. 2B, the first through third colors may be assigned to the first through third patterns 101 through 103, respectively. For example, the color decomposition may be performed during a data preparation operation. As another example, the color decomposition may be performed during a design rule check operation.

"Routing" is an operation of arranging wiring layers and vias required to appropriately connect the placed standard cells according to design rules with respect to the integrated circuit. Each of the wiring layers may include a plurality of patterns, and the patterns formed in the wiring layers of different levels may be electrically connected to one another through a via including a conductive material. Here, the wiring layer may include a conductive material, such as a metal, and thus, may be referred to as a metal layer. However, the present inventive concept may not be limited thereto. In order to apply the TPL, the color decomposition may be necessary. For example, when the routing and the color decomposition are performed together by using a color-aware routing algorithm, a complexity of the algorithm may increase.

According to an exemplary embodiment of the present inventive concept, the colorless routing that constrains minimum spaces between the first through third patterns 101 through 103 of the TPL layer may be performed, without considering the first through third colors according to the TPL layer during the routing operation. Thus, the complexity of the routing algorithm may be decreased. Also, according to an exemplary embodiment of the present inventive concept, the first through third patterns 101 through 103 of the TPL layer may be arranged to satisfy the space constraints such that a color violation does not occur, and the possibility of the occurrence of the color violation may be substantially reduced in a color violation check operation performed after the colorless routing operation.

Figure 2C:
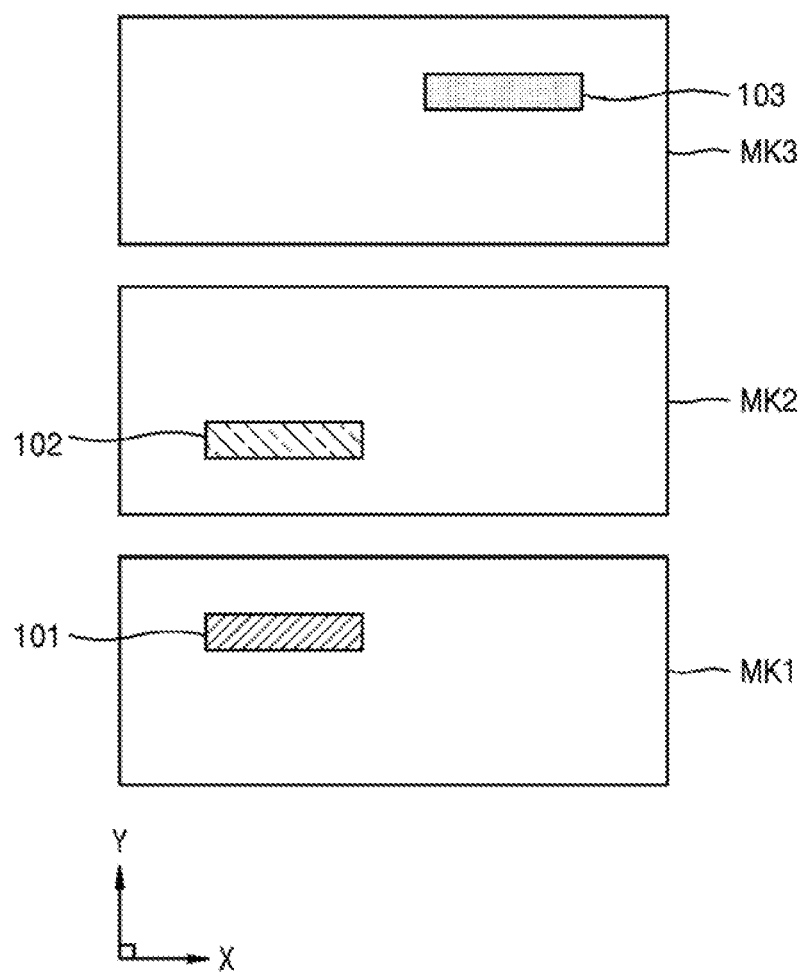
Figure 2D:
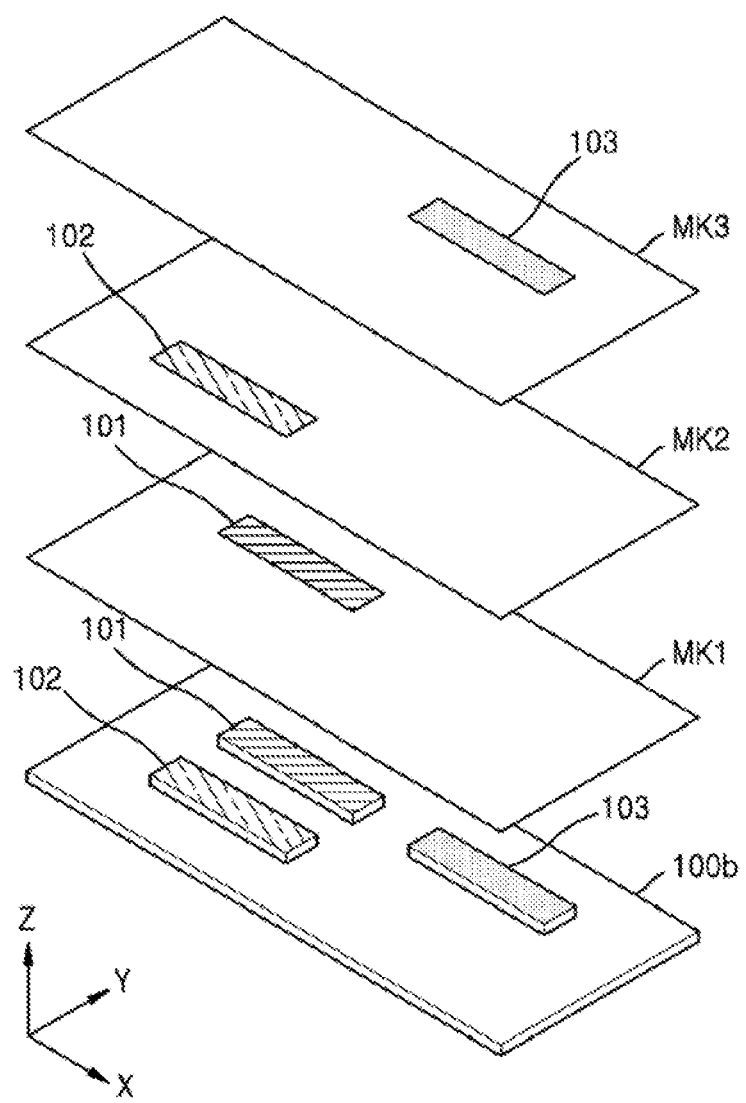

In operation S160, based on the layout on which the color decomposition is completed, first through third masks MK1 through MK3 may be generated. In FIG. 2C, the first mask MK1 may include the first pattern 101 to which the first color may be assigned, the second mask MK2 may include the second pattern 102 to which the second color may be assigned, and the third mask MK3 may include the third pattern 103 to which the third color may be assigned.

In operation S180, a semiconductor device 100b in which the integrated circuit is implemented may be manufactured by using the generated first through third masks MK1 through MK3. In one embodiment, the semiconductor device 100b in which the integrated circuit is implemented may be formed by performing various semiconductor processes on a semiconductor substrate including, for example, a wafer by using the first through third masks MK1 through MK3. In one example, the process using the masks may denote a patterning process via a lithography process. By means of this patterning process, a desired pattern may be formed on the semiconductor substrate or a material layer that may be formed on the semiconductor substrate. In another example, the semiconductor processes may include a deposition process, an etching process, an ion process, a cleansing process, etc. In addition, the semiconductor processes may include a packaging process that may mount the semiconductor device on a printed circuit board (PCB) and seals the mounted semiconductor device with a sealing member. The semiconductor processes may include a test process that performs a test on the semiconductor device or the package.

Figure 3:
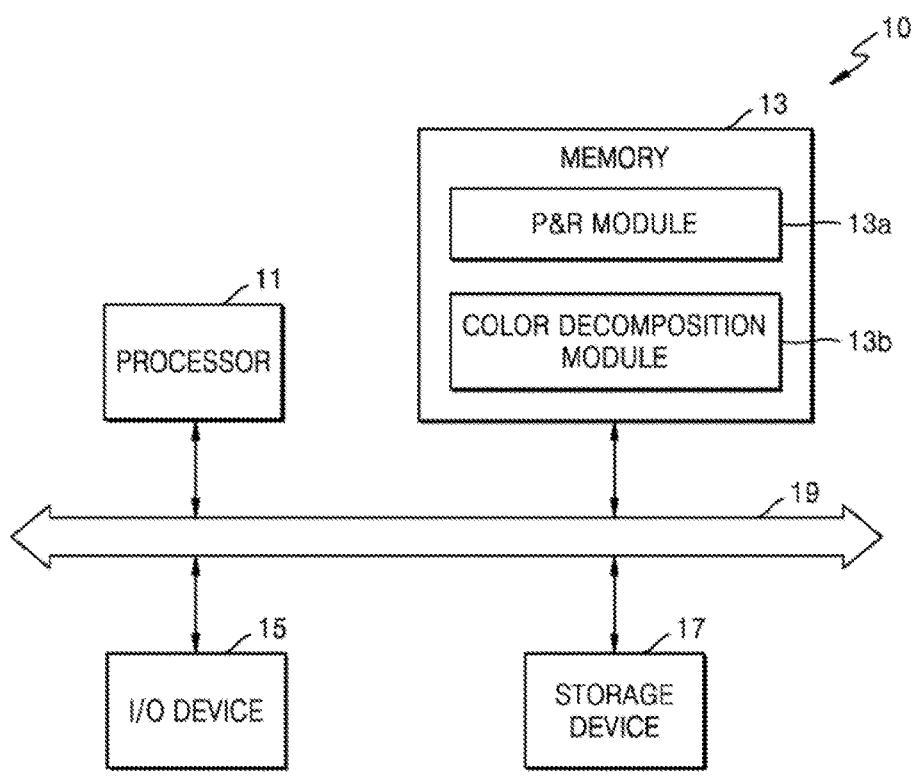
FIG. 3 is a block diagram of a computing system for designing an integrated circuit, according to an exemplary embodiment of the present inventive concept.

FIG. 3 is a block diagram of a computing system 10 for designing the integrated circuit according to an exemplary embodiment of the present inventive concept.

Referring to FIG. 3, the computing system 10 for designing the integrated circuit (hereinafter, referred to as an "integrated circuit design system") may include a processor 11, a memory 13, an input/output device 15, a storage device 17, and a bus 19. For example, the integrated circuit design system 10 may perform operations S100, S120, and S140 of FIG. 1. According to an exemplary embodiment of the present inventive concept, the integrated circuit design system 10 may be implemented as an integrated device, and thus, may also be referred to as an integrated circuit design device. The integrated circuit design system 10 may be provided as an exclusive device for designing the integrated circuit of the semiconductor device. However, the integrated circuit design system 10 may be a computer for driving various simulation tools or design tools.

The processor 11 may be configured to execute instructions for performing at least one of various operations for designing the integrated circuit. In one example, the processor 11 may communicate, via the bus 19, with the memory 13, the input/output device 15, and the storage device 17. To execute operation of designing the integrated circuit, the processor 11 may drive a P&R module 13a loaded to the memory 13, and to execute a color decomposition operation with respect to the patterns included in the TPL, layer, the processor 11 may drive a color decomposition module 13h loaded to the memory 13.

The memory 13 may store programs including instructions for performing placement and routing operations for designing the integrated circuit, and for performing the color decomposition operation. According to an exemplary embodiment of the present inventive concept, the memory 13 may store the P&R module 13a and the color decomposition module 13b, and the P&R module 13a and the color decomposition module 13b may be loaded to the memory 13 from the storage device 17. The P&R module 13a may be, for example, a program including instructions for performing the placement operation according to operation S100 of FIG. 1 and for performing the colorless routing operation according to operation S120 of FIG. 1. The color decomposition module 13b may be, for example, a program including instructions for performing the color decomposition operation according to operation S140 of FIG. 1. However, the present inventive concept may not be limited thereto, and the memory 13 may further store various modules, such as a timing analysis module, a simulation module, etc. The memory 13 may be a volatile memory, such as static random-access memory (SRAM) or dynamic random-access memory (DRAM), or a nonvolatile memory, such as phase-change random-access memory (PRAM), magnetic random-access memory (MRAM), resistive random-access memory (ReRAM), ferroelectric random-access memory (FRAM), a flash memory, etc.

Figure 4:
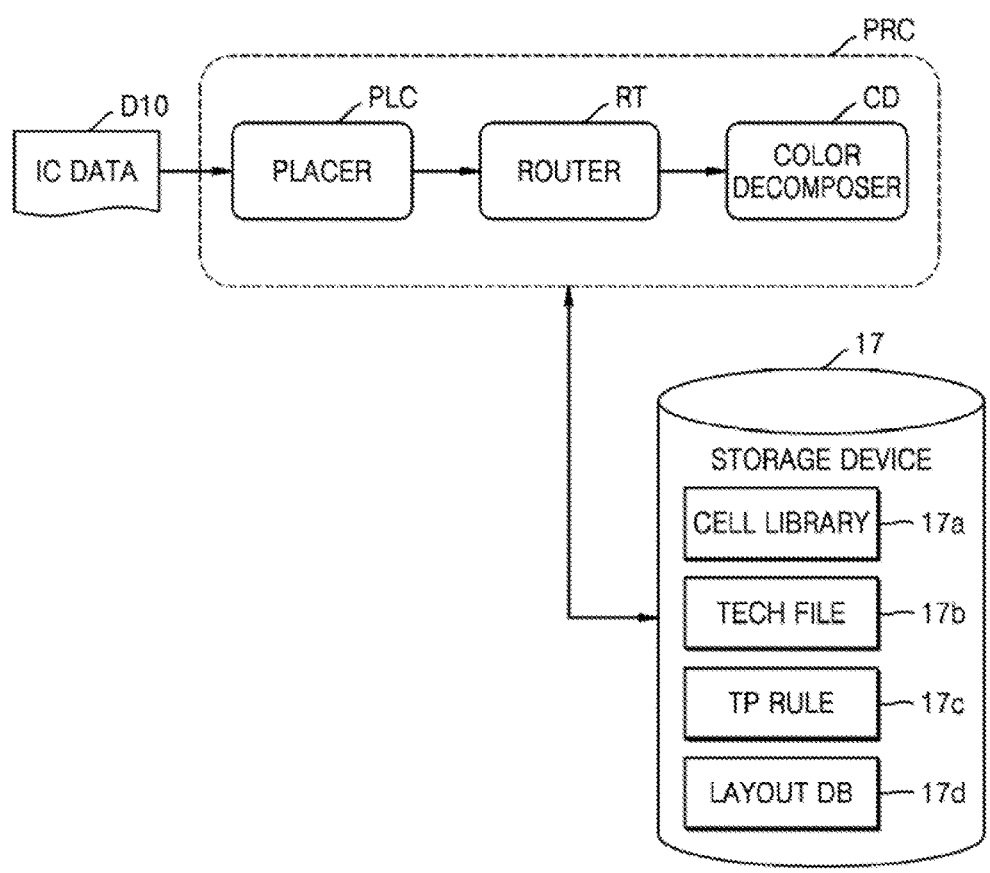
FIG. 4 illustrates an example of procedures stored in a memory of FIG. 3.

The input/output device 15 may control a user input or an output with respect to user interface devices. For example, the input/output device 15 may include an input device, such as a keyboard, a mouse, a touchpad, etc., and may receive integrated circuit design data. For example, the input/output device 15 may include an output device, such as a display, a speaker, etc., and may display a placement result, a routing result, or a color decomposition result. The storage device 17 may store various data related to the P&R module 13a and the color decomposition module 13b. The storage device 17 may include a memory card (MMC, eMMC, SD, MicroSD, etc.), a solid state drive (SSD), a hard disk drive (HDD), etc. FIG. 4 illustrates an example of procedures stored in the memory 13 of FIG. 3 according to an exemplary embodiment of the present inventive concept.

Referring to FIG. 4, the program stored in the memory 13 may include a plurality of procedures PRC. For example, the procedures PRC may refer to a series of instructions for performing specific tasks. The procedures PRC may also be referred to as a function, a routine, a subroutine, a subprogram, etc. According to an exemplary embodiment of the present inventive concept, the procedures PRC may include a placer PLC, a router RT, and a color decomposer CD. In one example, the processor 11 of FIG. 3 may perform one or more operations by executing one of the procedures PRC, for example, the placer PLC, the router RT, or the color decomposition CD, and the processor 11 may also be referred to as the procedures PLC, RT, or CD performing the operation.

The storage device 17 may store a cell library 17a, a technology file 17b, a triple patterning (TP) rule 17c, and a layout DB 17d. The cell library 17a may store information with respect to a standard cell that may be necessary to generate the layout of the integrated circuit, and may be referred to as a standard cell library. The TP rule 17c may store a patterning rule with respect to the TPL layer. The layout DB 17d may store information with respect to the layout generated in the procedures PRC, for example, physical information about the layout.

The technology file 17b may store rules and materials that may be used in a process of manufacturing the integrated circuit. For example, the technology file 17b may store a layer definition, a device definition, design rules, etc. According to an exemplary embodiment of the present inventive concept, the technology file 17b may include space constraints with respect to patterns of the TPL layer. The space constraints included in the technology file 17b will be described later with reference to FIGS. 7A through 8E, 10A through 10C, and 12.

The placer PLC may place standard cells based on integrated circuit (IC) design data D10. In one embodiment, the placer PLC may perform the placement operation by accessing the cell library 17a. The router RT may perform the colorless routing on the standard cells placed by the placer PLC and may generate the layout. In one embodiment, the router RT may perform the colorless routing based on the space constraints included in the technology file 17b. The color decomposer CD may assign first through third colors respectively corresponding to first through third masks, to patterns included in the TPL layer, based on the generated layout. In one embodiment, the color decomposer CD may perform the color decomposition based on the TP rule 17c.

Figure 5:
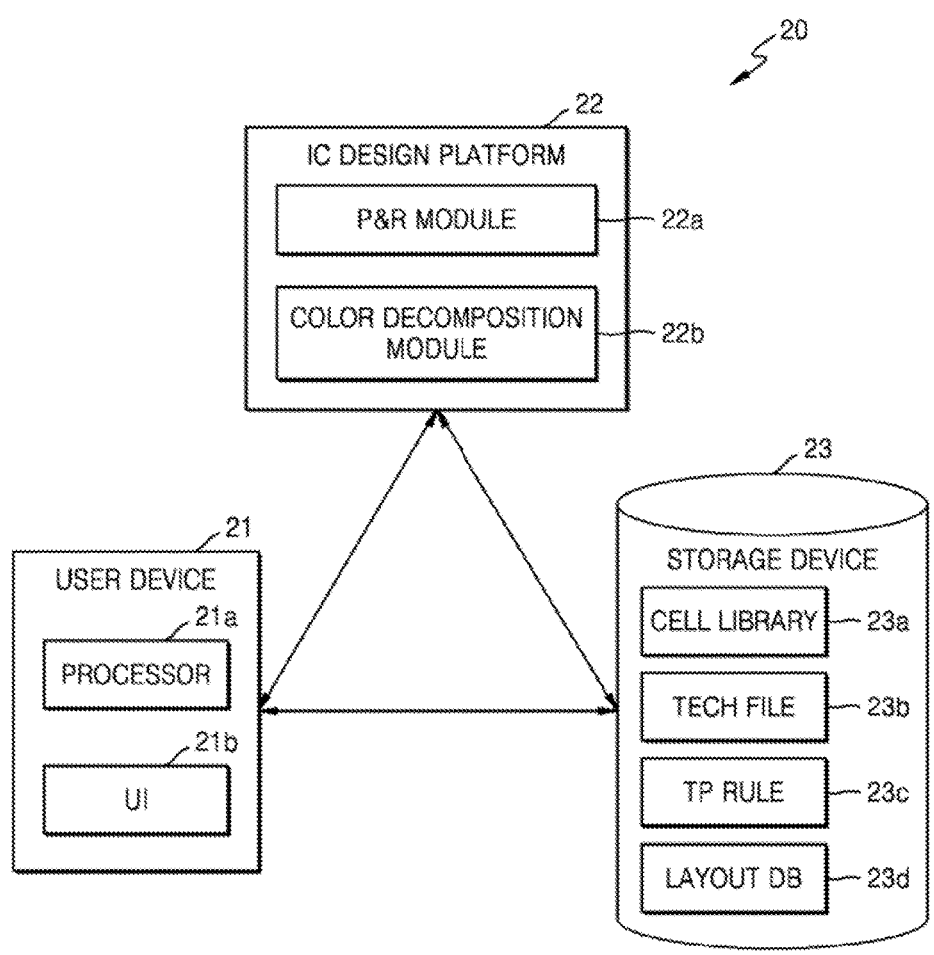
FIG. 5 is a block diagram of a computing system for designing an integrated circuit, according to an exemplary embodiment of the present inventive concept.

FIG. 5 is a block diagram of a computing system 20 for designing the integrated circuit according to an exemplary embodiment of the present inventive concept.

Referring to FIG. 5, the computing system 20 for designing the integrated circuit may include a user device 21, an integrated circuit design platform 22, and a storage device 23. In one example, the integrated circuit design system 20 may perform operations S100, S120, and S140 of FIG. 1. According to an exemplary embodiment of the present inventive concept, at least one of the user device 21, the integrated circuit design platform 22, and the storage device 23 may be a separate device, and the user device 21, the integrated circuit design platform 22, and the storage device 23 may be connected to one another via wired or wireless communication or a network. According to an exemplary embodiment, at least one of the user device 21, the integrated circuit design platform 22, and the storage device 23 may be arranged to be apart from the others.

The user device 21 may include a processor 21a and a user interface (UI) 21b. Based on the user input that is input via the user interface 21b, the processor 21a may drive the integrated circuit design platform 22. The integrated circuit design platform 22 may include a P&R module 22a and a color decomposition module 22b, which are instructions for designing an integrated circuit. The P&R module 22a and the color decomposition module 22b may respectively be substantially the same as the P&R module 13a and the color decomposition module 13b of FIG. 3. The storage device 23 may include a cell library 23a, a technology file 23b, a TP rule 23c, and a layout DB 23d.

Figure 6:
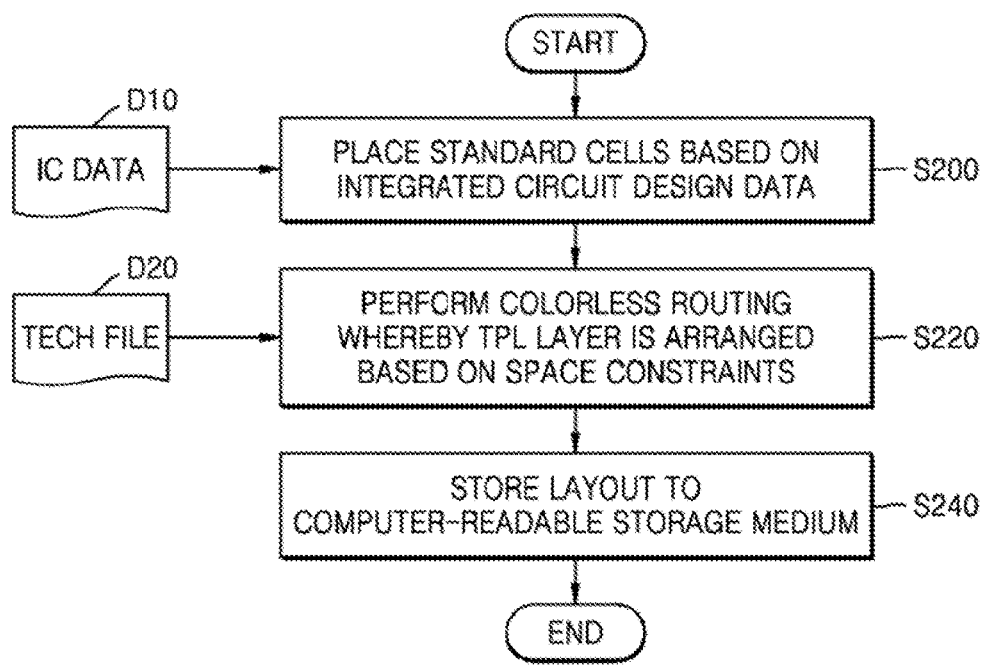
FIG. 6 is a flowchart of a method of designing an integrated circuit, according to an exemplary embodiment of the present inventive concept.

FIG. 6 is a flowchart of a method of designing the integrated circuit according to an exemplary embodiment of the present inventive concept.

Referring to FIG. 6, the method of designing the integrated circuit according to the present embodiment of the present inventive concept may be performed by using a tool for designing the integrated circuit. For example, the tool for designing the integrated circuit may be a program including a plurality of instructions that may be executed by a processor. Accordingly, the method of designing the integrated circuit may be referred to as a computer-implemented method for designing the integrated circuit. For example, the method according to an exemplary embodiment may be performed by the integrated circuit design system 10 of FIG. 3 or the integrated circuit design system 20 of FIG. 5. Hereinafter, the present embodiment will be described with reference to FIGS. 3, 4 and 6 together.

In operation S200, the standard cells may be placed based on the IC design data D10 defining the integrated circuit. For example, operation S200 may be performed by the processor 11 by using a P&R tool corresponding to the P&R module 13a. In one exemplary embodiment, the IC design data D10 may be received, and the standard cells selected from the plurality of standard cells stored in the cell library 17a may be placed according to the IC design data D10 by accessing the storage device 17 storing the cell library 17a. In one example, the IC design data D10 may be generated from data defined as an abstract form with respect to a behavior of the integrated circuit, for example, data that is defined as a register-transfer level (RTL) through synthesis by using the standard cell library. For example, the IC design data D10 may be a bitstream or netlist.

In operation S220, the colorless routing may be performed whereby patterns included in the TPL layer may be arranged based on space constraints included in a technology file D20. For example, operation S220 may be performed by the processor 11 by using the P&R tool corresponding to the P&R module 13a. In one embodiment, the processor 11 may arrange the patterns included in the TPL layer based on the space constraints stored in the technology file D20 by accessing the storage device 17 storing the technology file D20.

In operation S240, the layout may be stored to a computer-readable storage medium. For example, the computer-readable storage medium may include any storage medium, data of which may be read by the computer during operation of providing instructions and/or data to the computer. For example, the computer-readable storage medium may include a magnetic or optical medium, such as a disk, a tape, CD-read-only memory (ROM), DVD-ROM, CD-R, CD-RW, DVD-R, DVD-RW, etc., a volatile or nonvolatile memory, such as RAM, ROM, a flash memory, etc., a nonvolatile memory accessible via a universal serial bus (USB) interface, a microelectromechanical system (MEMS), etc. The computer-readable storage medium may be inserted into the computer, integrated into the computer, or coupled to the computer via a communication medium, such as a network and/or a wireless link.

After operation S240, output data defining the integrated circuit, for example, layout data may be provided to the semiconductor process module. In one example, the output data may have a format including all layout information of the standard cells, for example, pattern information in all layers. For example, the output data may have the graphic design system (GDS) II format. Alternatively, the output data may have a format including external information of the standard cells, such as a pin of the standard cells. For example, the output data may have the LEF format or the Milkyway format.

FIGS. 7A through 7E show space constraints for patterns to which different colors may be assigned according to an exemplary embodiment of the present inventive concept.

Figure 7A:
FIGS. 7A through 7E show space constraints for patterns to which different colors are assigned, according to an exemplary embodiment of the present inventive concept.
Figure 7B:
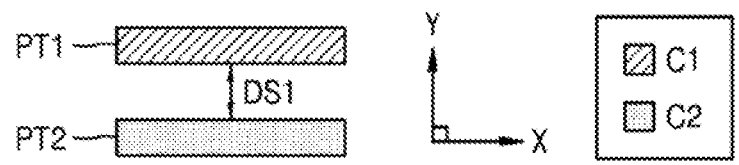

A table 200 illustrated in FIG. 7A may show definitions of first through fourth different color spaces DS1 through DS4 and may be included in a technology file (for example, 17b of FIG. 3). FIG. 7B may show the first different color space DS1, FIG. 7C may show the second different color space DS2, FIG. 7D may show the third different color space DS3, and FIG. 7E may show the fourth different color space DS4. According to an exemplary embodiment of the present inventive concept, a first pattern PT1 may be a pattern, to which a first color C1 may be assigned, and a second pattern PT2 may be a pattern, to which a second color C2 may be assigned. In this specification, a "side" may refer to an "edge" of each pattern in a lengthwise direction, and a "tip" may refer to an edge of each pattern in a width direction.

Referring to FIG. 7B, the first and second patterns PT1 and PT2 may extend in a first direction (for example, a direction X), and may be adjacent to each other in a second direction (for example, a direction Y) perpendicular to the first direction. For example, the first and second patterns PT1 and PT2 may be arranged on two tracks that are adjacent to each other, respectively. The first different color space DS1 may be defined as a minimum side-to-side (S2S) space between the first and second patterns PT1 and PT2.

Figure 7C:
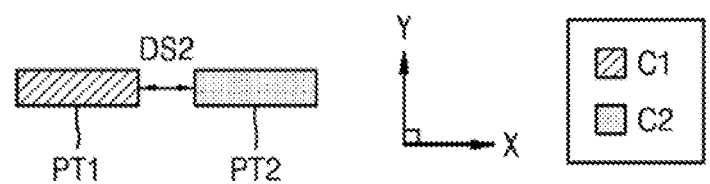

Referring to FIG. 7C, the first and second patterns PT1 and PT2 may extend in the first direction and may be adjacent to each other in the first direction. For example, the first and second patterns PT1 and PT2 may be arranged on substantially the same track. The second different color space DS2 may be defined as a minimum tip-to-tip (T2T) space between the first and second patterns PT1 and PT2. According to an exemplary embodiment, the second different color space DS2 may be greater than the first different color space DS1. However, the present inventive concept may not be limited thereto. In one or more exemplary embodiments, the second different color space DS2 may be substantially equal to the first different color space DS1.

Also, in one or more exemplary embodiments, the second different color space DS2 may be less than the first different color space DS1.

Figure 7D:
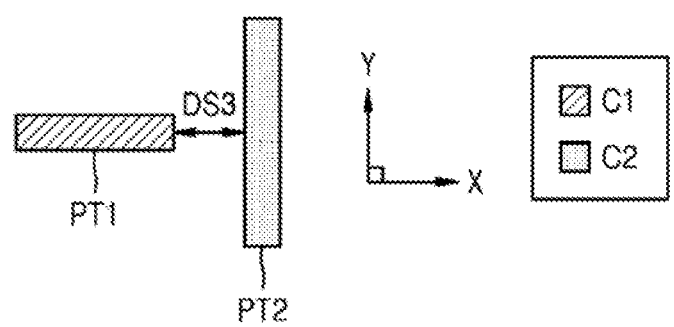

Referring to FIG. 7D, the first pattern PT1 may extend in the first direction and the second pattern PT2 may extend in the second direction. For example, the first pattern PT1 may be arranged on one track, and the second pattern PT2 may be arranged across a plurality of tracks. The third different color space DS3 may be defined as a minimum tip-to-side (T2S) space between the first and second patterns PT1 and PT2. According to an exemplary embodiment, the second and third different color spaces DS2 and DS3 may be different from each other. However, the present inventive concept may not be limited thereto. In one or more embodiments, the second and third different color spaces DS2 and DS3 may be substantially the same.

Figure 7E:
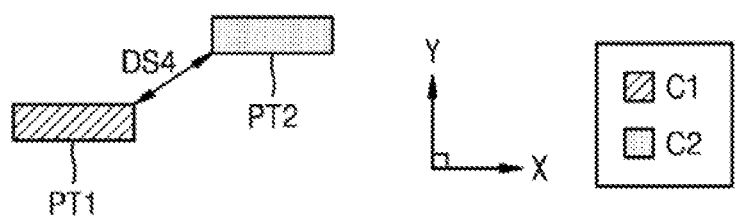

Referring to FIG. 7E, the first and second patterns PT1 and PT2 may extend in the first direction and may not be adjacent to each other in the second direction. For example, the first and second patterns PT1 and PT2 may be arranged on different tracks. The fourth different color space DS4 may be defined as a minimum corner-to-corner (C2C) space between the first and second patterns PT1 and PT2.

FIGS. 8A through 8E show space constraints for patterns to which the same color is assigned according to an exemplary embodiment of the present inventive concept.

Figure 8A:
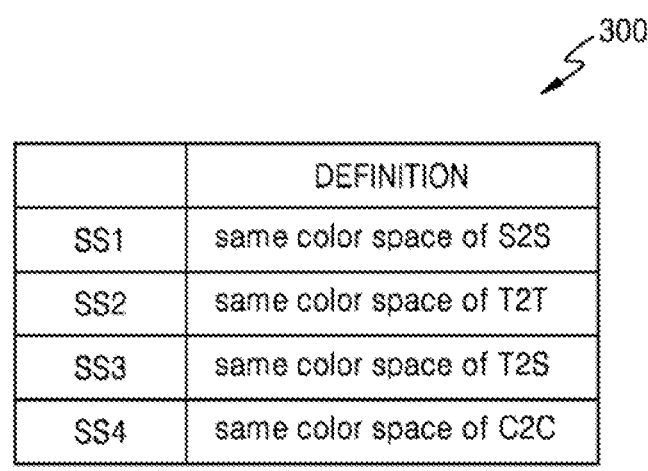
FIGS. 8A through 8E show space constraints for patterns to which the same color is assigned, according to an exemplary embodiment of the present inventive concept.
Figure 8B:
Figure 8C:
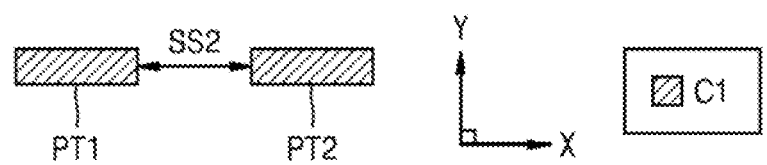
Figure 8D:
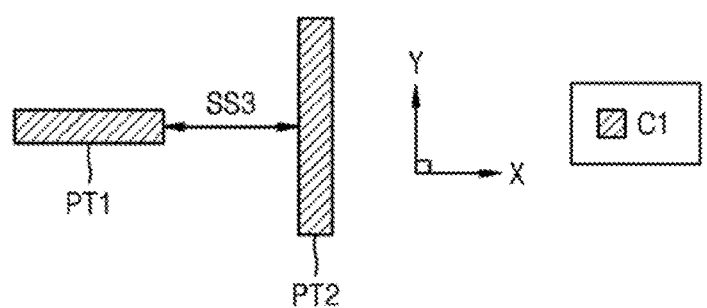
Figure 8E:
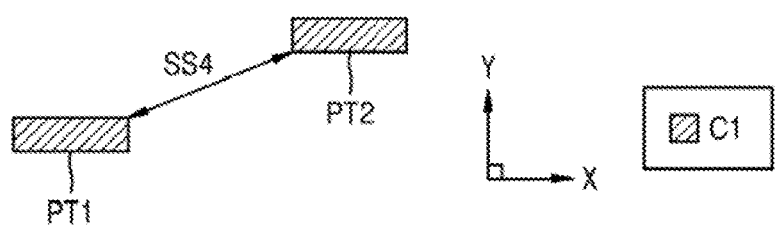

A table 300 illustrated in FIG. 8A may show definitions of first through fourth same color spaces SS1 through SS4, and may be included in the technology file (for example, 17b of FIG. 4). FIG. 8B shows the first same color space SS1, FIG. 8C shows the second same color space SS2, FIG. 8D shows the third same color space SS3, and FIG. 8E shows the fourth same color space 884. According to one or more exemplary embodiments of the present inventive concept, the first and second patterns PT1 and PT2 may be patterns, to which the first color C1 is assigned.

Referring to FIG. 8B, the first and second patterns PT1 and PT2 may extend in the first direction (for example, the direction X) and may be adjacent to each other in the second direction (for example, the direction Y). For example, the first and second patterns PT1 and PT2 may be arranged on two tracks that may be adjacent to each other in the direction Y, respectively. The first same color space SS1 may be defined as a minimum S2S space between the first and second patterns PT1 and PT2.

Referring to FIG. 8C, the first and second patterns PT1 and PT2 may extend in the first direction, and may be adjacent to each other in the first direction. For example, the first and second patterns P11 and P12 may be arranged on substantially the same track. The second same color space SS2 may be defined as a minimum T2T space between the first and second patterns PT1 and PT2. According to an exemplary embodiment of the present inventive concept, the second same color space SS2 may be greater than the first same color space SS1. However, the present inventive concept may not be limited thereto. In some embodiments, the first and second same color spaces SS1 and SS2 may be substantially the same with each other. Also, in some embodiments, the second same color space SS2 may be less than the first same color space SS1.

Referring to FIG. 8D, the first pattern PT1 may extend in the first direction, and the second pattern PT2 may extend in the second direction. For example, the first pattern PT1 may be arranged on one track, and the second pattern PT2 may be arranged across a plurality of tracks. The third same color space SS3 may be defined as the minimum T2S space between the first and second patterns PT1 and PT2. According to an exemplary embodiment of the present inventive concept, the second and third same color spaces 582 and SS3 may be different from each other. However, the present inventive concept may not be limited thereto. In some embodiments of the present inventive concept, the second and third same color spaces SS2 and SS3 may be the same.

Referring to FIG. 8E, the first and second patterns PT1 and PT2 may extend in the first direction, and may not be adjacent to each other in the second direction. For example, the first and second patterns PT1 and PT2 may be arranged on different tracks. The fourth same color space SS4 may be defined as a minimum C2C space between the first and second patterns PT1 and PT2.

Figure 9:
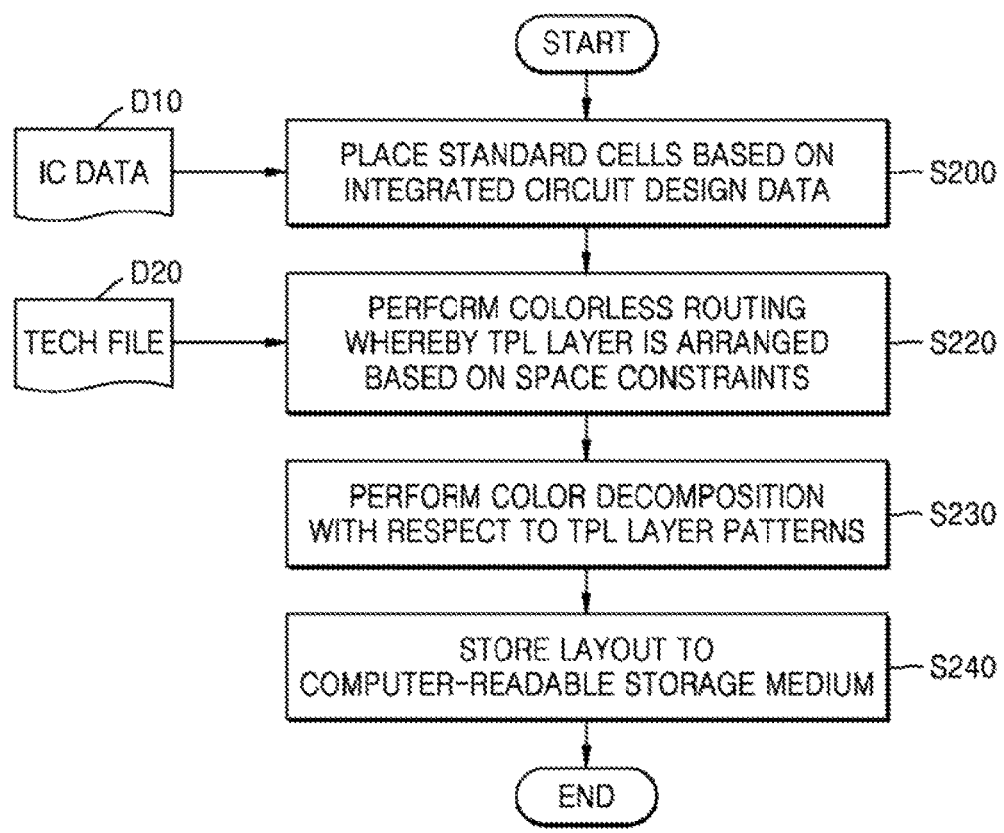
FIG. 9 is a flowchart of a method of designing an integrated circuit, according to an exemplary embodiment of the present inventive concept.

FIG. 9 is a flowchart of a method of designing an integrated circuit according to an exemplary embodiment of the present inventive concept.

Referring to FIG. 9, the method of designing the integrated circuit according to the present embodiment, may correspond to a modified embodiment of the embodiment illustrated in FIG. 6. In one embodiment, as compared with the embodiment of FIG. 6, the method according to the present embodiment may further include operation S230. In operation S200, the standard cells may be placed based on the integrated circuit design data D10. In operation S220, to generate the layout of the integrated circuit, the colorless routing may be performed in which the patterns included in the TPL layer may be arranged according to the space constraints included in the technology file D20.

In operation S230, the color decomposition may be performed with respect to patterns included in a layer to which TPL is to be applied, for example, with respect to TPL layer patterns. In one exemplary embodiment, the color decomposition may include assigning different colors to the patterns, when a space between adjacent patterns is less than a minimum space between patterns to which the same color is assigned, and assigning the same color to the patterns when the space between the adjacent patterns is substantially equal to or greater than the minimum space between the patterns to which the same color is assigned. In operation S240, the layout on which the color decomposition has been completed may be stored to the computer-readable storage medium.

Figure 10A:
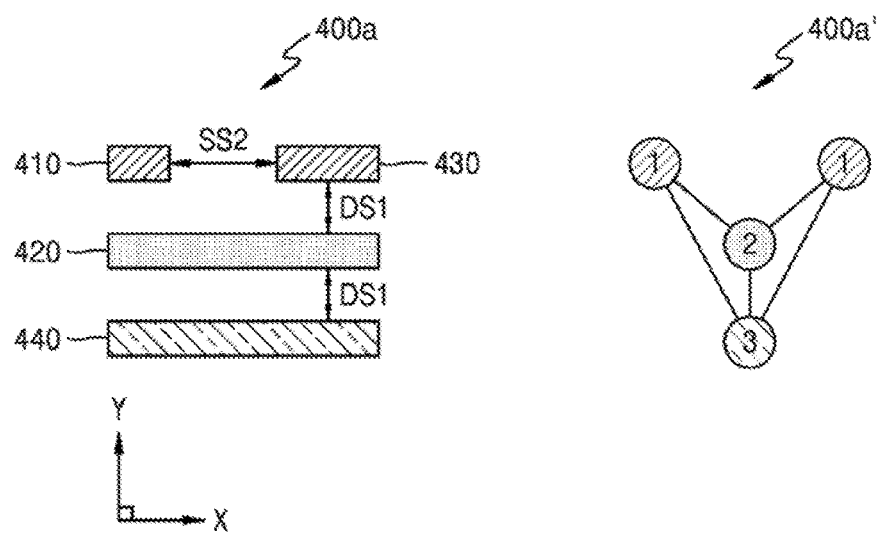
FIGS. 10A through 10C show space constraints for patterns that are included in a bi-directional layer, according to one or more exemplary embodiments of the present inventive concept.
Figure 10B:
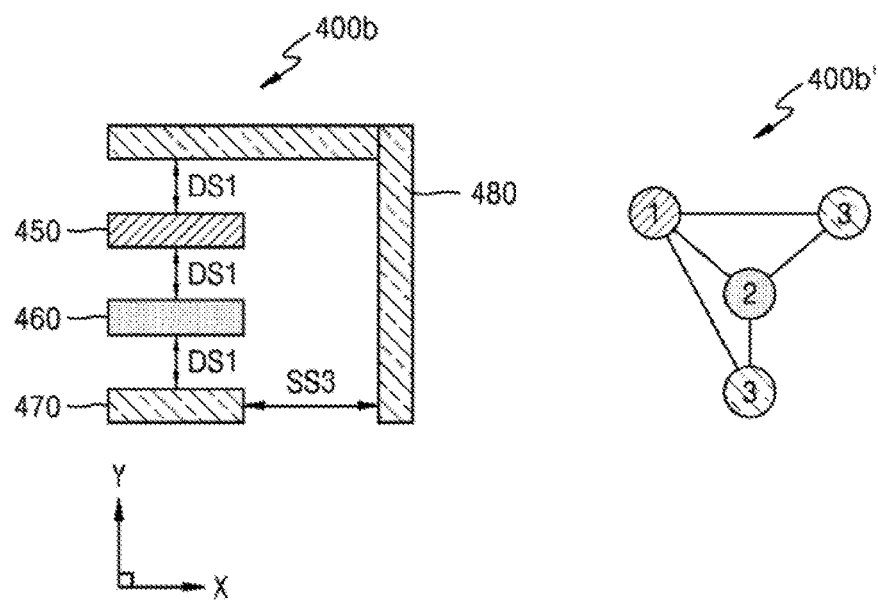
Figure 10C:
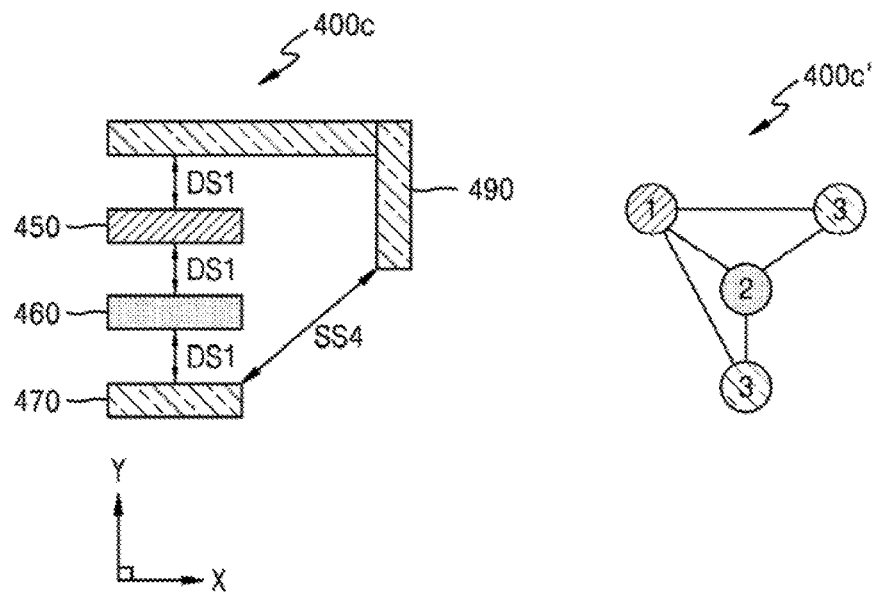

FIGS. 10A through 10C show space constraints for patterns included in a bi-directional layer according to one or more exemplary embodiments of the present inventive concept. The aspects described with reference to FIGS. 7A through 8E may be applied to the embodiments illustrated in FIGS. 10 through 10C.

Referring to FIG. 10A, an integrated circuit 400a may include first through fourth patterns 410 through 440 included in the TPL layer. According to the present embodiment, the TPL layer may be implemented as the bi-directional layer, and the bi-directional layer may include patterns extending in the first direction (for example, the direction X) and patterns extending in the second direction (for example, the direction Y). The first through fourth patterns 410 through 440 may extend in the first direction. According to an exemplary embodiment, the space constraints included in the technology file may include first and second space constraints. Hereinafter, the first and second space constraints will be described.

A first space constraint may define the S2S space to be substantially equal to or greater than the first different color space DS1. Accordingly, the S2S space between the second and third patterns 420 and 430, and the S2S space between the second and fourth patterns 420 and 440 may be substantially equal to or greater than the first different color space DS1. The second space constraint may define the T2T space to be substantially equal to or greater than the second same color space SS2. Accordingly, the T2T space between the first and third patterns 410 and 430 may be substantially equal to or greater than the second same color space SS2.

A color graph 400a' may be generated by modeling a connection relationship of the first through fourth patterns 410 through 440 included in the TPL layer of the integrated circuit 400a. In one embodiment, the color graph 400a' may be generated by modeling each of the first through fourth patterns 410 through 440 of the integrated circuit. 400 as a "node," and modeling each of the connections between nodes in which a space between adjacent patterns is less than the same color space as an "edge." According to an exemplary embodiment of the present inventive concept, the T2T space between the first and third patterns 410 and 430 assigned to the same color may be substantially equal to or greater than the second same color space SS2, and thus, the first and third patterns 410 and 430 may not be connected to each other in the color graph 400a'.

Referring to FIG. 10B, an integrated circuit 400b may include first through fourth patterns 450 through 480 included in the TPL layer. According to the present embodiment, the TPL layer may be implemented as the bi-directional layer, and the first through third patterns 450 through 470 may extend in the first direction, and the fourth pattern 480 may have a portion extending in the first direction and a portion extending in the second direction. According to an exemplary embodiment, the space constraints included in the technology file may include first and third space constraints. Hereinafter, the first and third space constraints will be described.

The first space constraint may define the S2S space to be substantially equal to or greater than the first different color space DS1. Accordingly, the S2S space between the first and second patterns 450 and 460, the S2S space between the second and third patterns 460 and 470, and the S2S space between the first and fourth patterns 450 and 480 may be substantially equal to or greater than the first different color space DS1. The third space constraint may define the T2S space to be substantially equal to or greater than the third same color space SS3. Accordingly, the T2S space between the third and fourth patterns 470 and 480 may be substantially equal to or greater than the third same color space SS3. According to an exemplary embodiment, the T2S space between the third and fourth patterns 470 and 480 assigned to the same color may be substantially equal to or greater than the third same color space SS3, and thus, the third and fourth patterns 470 and 480 may not be connected to each other in a color graph 400b'.

Referring to FIG. 10C, an integrated circuit 40c may include first through fourth patterns 450 through 470 and 490 included in the TPL layer. According to an exemplary embodiment, the TPL, layer may be implemented as the bi-directional layer, the first through third patterns 450 through 470 may extend in the first direction, and the fourth pattern 490 may have a portion extending in the first direction and a portion extending in the second direction. A length of the fourth pattern 490 in the second direction may be less than a length of the fourth pattern 480 of FIG. 10B in the second direction. According to an exemplary embodiment, the space constraints included in the technology file may include first and fourth space constraints. Hereinafter, the first and fourth space constraints will be described.

The first space constraint may define the S2S space to be substantially equal to or greater than the first different color space DS1. Accordingly, the S2S space between the first and second patterns 450 and 460, the S2S space between the second and third patterns 460 and 470, and the S2S space between the first and fourth patterns 450 and 490 may be substantially equal to or greater than the first different color space DS1. The fourth space constraint may define the C2C space to be substantially equal to or greater than the fourth same color space SS4. Accordingly, the C2C space between the third and fourth patterns 470 and 490 may be substantially equal to or greater than the fourth same color space SS4. According to an exemplary embodiments, the C2C space between the third and fourth patterns 470 and 490 assigned to the same color may be substantially equal to or greater than the fourth same color space SS4, and thus, the third and fourth patterns 470 and 490 may not be connected to each other in a color graph 400e.

FIGS. 11A through 11D show color violation check results with respect to patterns included in the bi-directional layer according to one or more exemplary embodiments of the present inventive concept.

Figure 11A:
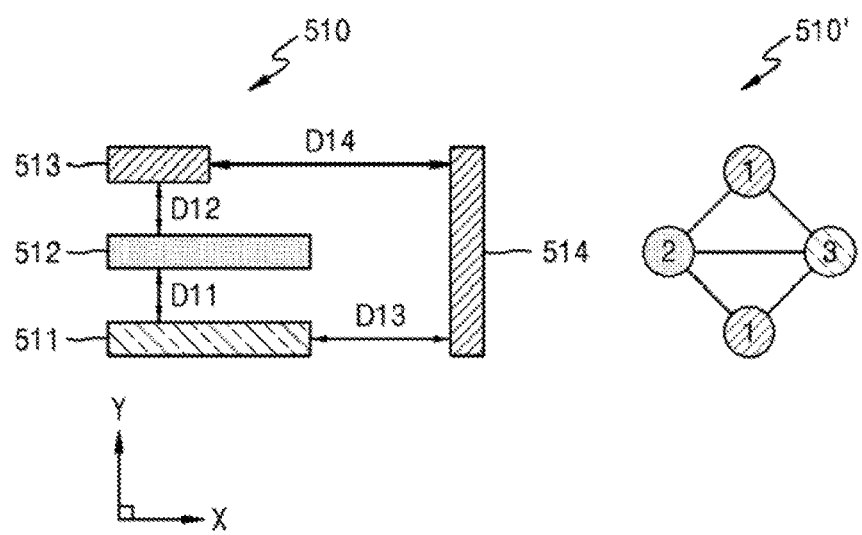
FIGS. 11A through 11E show color violation check results with respect to patterns that are included in a bi-directional layer, according to an exemplary embodiment of the present inventive concept.
Figure 11B:
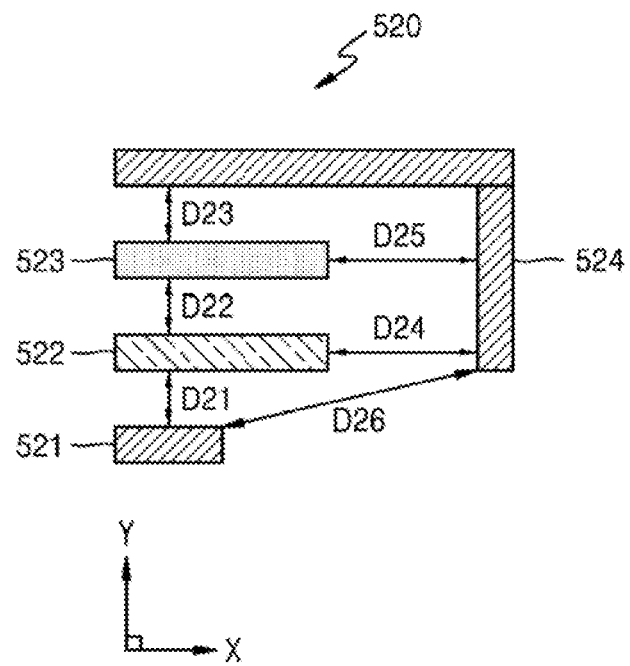

Referring to FIG. 11A, an integrated circuit 510 may be generated by performing the colorless routing based on the space constraints illustrated in FIGS. 10A through 10C, and may include first through fourth patterns 511 through 514. The S2S spaces D11 and D12 between the first through third patterns 511 through 513 may be substantially equal to or greater than the first different color space DS1, and thus, may satisfy the first space constraint. The T2S spaces D13 and D14 between the first through fourth patterns 511 through 514 may be substantially equal to or greater than the third different color space DS3 and the third same color space SS3, respectively, and thus, may satisfy the third space constraints. Accordingly, color violation may not be indicated in a color graph 510' based on the integrated circuit 510.

Figure 11C:
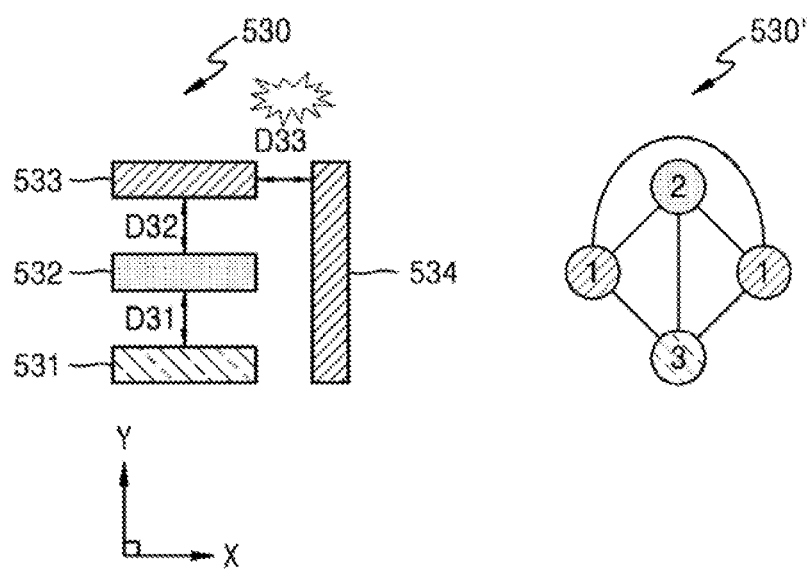
Figure 11D:
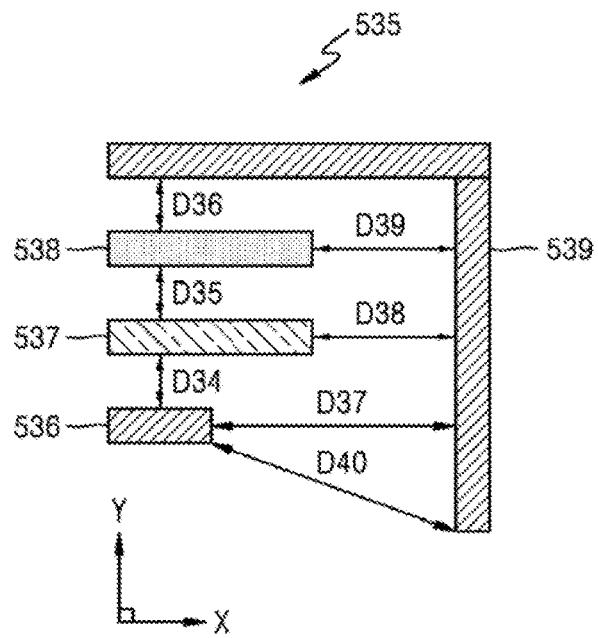

Referring to FIG. 11D, an integrated circuit 520 may be generated by performing the colorless routing based on the space constraints illustrated in FIGS. 10A through 10C, and may include first through fourth patterns 521 through 524. The S2S spaces D21 through D23 between the first through fourth patterns 521 through 524 may be substantially equal to or greater than the first different color space DS1, and thus, may satisfy the first space constraint. The T2S spaces D24 and D25 between the second through fourth patterns 522 through 524 may be substantially equal to or greater than the third same color space SS3, and thus, may satisfy the third space constraint. The C2C space D26 between the first and fourth patterns 521 and 524 may be substantially equal to or greater than the fourth same color space SS4, and thus, may satisfy the fourth space constraint.

Referring to FIG. 11C, an integrated circuit 530 may correspond to a case in which the colorless routing based on the space constraints illustrated in FIGS. 10A through 10C may not be performed, and may include first through fourth patterns 531 through 534. The S2S spaces D31 and D32 between the first through third patterns 531 through 533 may be substantially equal to or greater than the first different color space DS1, and thus, may satisfy the first space constraint. The T2S space 133 between the third and fourth patterns 533 and 534 may be less than the third same color space SS3. Here, since the same color is assigned to the third and fourth patterns 533 and 534, a color violation may occur between the third and fourth patterns 533 and 534. Accordingly, in a color graph 530' based on the integrated circuit 530, the color violation may be indicated between the patterns to which the first color is assigned. However, according to the embodiments illustrated in FIGS. 10A through 10C, the third space constraint may constrain the T2S space so as to have the T2S be substantially equal to or greater than the third same color space SS3, and thus, the color violation illustrated in FIG. 11C may not occur.

Referring to FIG. 11D, an integrated circuit 535 may be generated by performing the colorless routing based on the space constraints illustrated in FIGS. 10A through 10C, and may include first through fourth patterns 536 through 539. The S2S spaces D34 through D36 between the first through fourth patterns 536 through 539 may be substantially equal to or greater than the first different color space DS1, and thus, may satisfy the first space constraint. The T2S space D37 between the first and fourth patterns 536 and 539 may be substantially equal to or greater than the third same color space SS3, and thus, may satisfy the third space constraint. The T2S spaces D38 and D39 between the second through fourth patterns 537 through 539 may be substantially equal to or greater than the third different color space DS3, and thus, may satisfy the third space constraint. The C2C space D40 between the first and fourth patterns 536 and 539 may be substantially equal to or greater than the fourth same color space SS4, and thus, may satisfy the fourth space constraint.

Figure 11E:
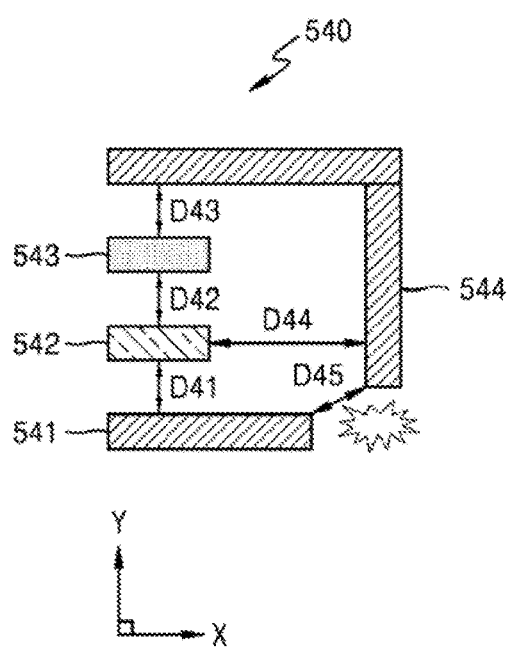

Referring to FIG. 11E, an integrated circuit 540 may correspond to a case in which the colorless routing based on the space constraints illustrated in FIGS. 10A through 10C may not be performed, and may include first through fourth patterns 541 through 544. The S2S spaces D41 through D43 between the first through fourth patterns 541 through 544 may be substantially equal to or greater than the first different color space DS1, and thus, may satisfy the first space constraint. The T2S space D44 between the second and fourth patterns 542 and 544 may be substantially equal to or greater than the third same color space SS3, and thus, may satisfy the third space constraint.

Meanwhile, the C2C space D45 between the first and fourth patterns 541 and 544 may be less than the fourth same color space SS4. In an exemplary embodiment, the same color is assigned to the first and fourth patterns 541 and 544, and a color violation may occur between the first and fourth patterns 541 and 544. Accordingly, a color graph based on the integrated circuit 540 may be substantially the same as the color graph 530' of FIG. 11C. However, according to the embodiments illustrated in FIGS. 10A through 10C, the fourth space constraint may constrain the C2C space to be substantially equal to or greater than the fourth same color space SS4, and thus, the color violation explained with respect to FIG. 11E may not occur.

Figure 12:
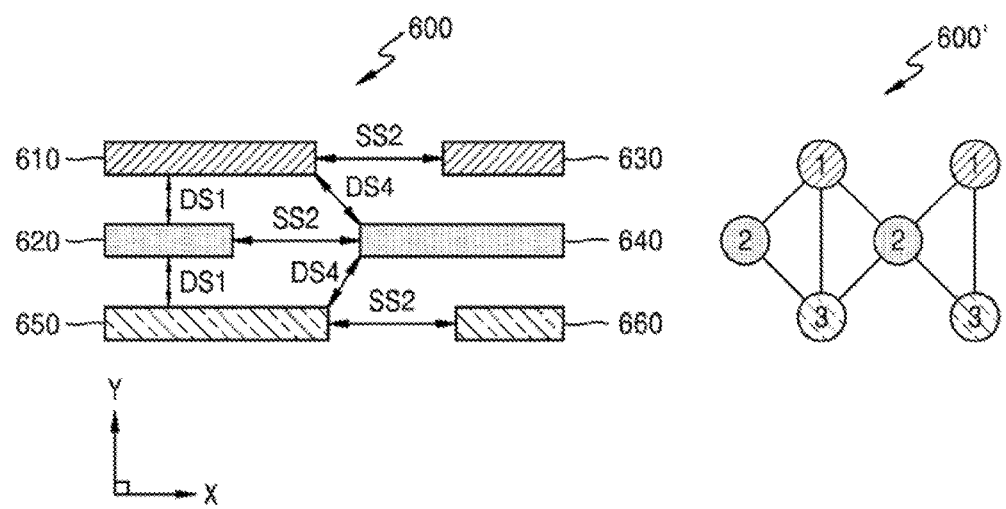
FIG. 12 shows space constraints for patterns that are included in a uni-directional layer, according to an exemplary embodiment of the present inventive concept.

FIG. 12 illustrates space constraints with respect to patterns included in a uni-directional layer according to an exemplary embodiment of the present inventive concept. The aspects described with reference to FIGS. 7A through 8E may be applied to the present embodiment.

Referring to FIG. 12, an integrated circuit 600 may include first through sixth patterns 610 through 660 included in the TPL layer. According to an exemplary embodiment, the TPL layer may be implemented as a uni-directional layer. The first through sixth patters 610 through 660 may extend in the first direction (for example, the direction X). According to an exemplary embodiment, the space constraints included in the technology file may include first through third space constraints. Hereinafter, the first through third space constraints will be described.

The first space constraint condition may define the S2S space to be substantially equal to or greater than the first different color space DS1. Accordingly, the S2S space between the first and second patterns 610 and 620, the S2S space between the third and fourth patterns 630 and 640, the S2S space between the second and fifth patterns 620 and 650, and the S2S space between the fourth and sixth patterns 640 and 660 may be substantially equal to or greater than the first different color space DS1. The second space constraint may define the T2T space to be substantially equal to or greater than the second same color space SS2. Accordingly, the T2T space between the first and third patterns 610 and 630, the T2T space between the second and fourth patterns 620 and 640, and the T2T space between the fifth and sixth patterns 650 and 660 may be substantially equal to or greater than the second same color space SS2.

The fourth space constraint may define the C2C space that may be substantially equal to or greater than the fourth different color space DS4. Accordingly, the C2C space between the first through sixth patterns 610 through 660 may be substantially equal to or greater than the fourth different color space DS4. According to an exemplary embodiment, since the TPL layer is the uni-directional layer, the TPL layer does not include a pattern extending in the second direction. Accordingly, according to an exemplary embodiment, the T2S space may not be permitted.

A color graph 600' may be generated by modeling a connection relationship of the first through sixth patterns 610 through 660 included in the TPL layer of the integrated circuit 600. According to an exemplary embodiment, the T2T space between the first and third patterns 610 and 630 assigned to the same color may be substantially equal to or greater than the second same color space SS2. Accordingly, in the color graph 600', the first and third patterns 610 and 630 may not be connected to each other. Likewise, the T2T space between the second and fourth patterns 620 and 640 assigned to the same color may be substantially equal to or greater than the second same color space SS2. Accordingly, in the color graph 600', the second and fourth patterns 620 and 640 may not be connected to each other. Likewise, the T2T space between the fifth and sixth patterns 650 and 660 assigned to the same color may be substantially equal to or greater than the second same color space SS2. Accordingly, in the color graph 600', the fifth and sixth patterns 650 and 660 may not be connected to each other.

Figure 13A:
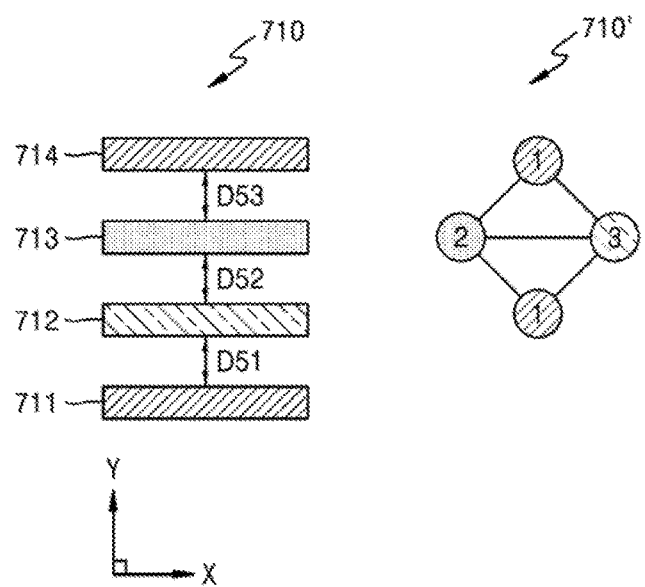
FIGS. 13A through 13C show color violation check results with respect to patterns that are included in a uni-directional layer, according to one or more exemplary embodiment of the present inventive concept.
Figure 13B:
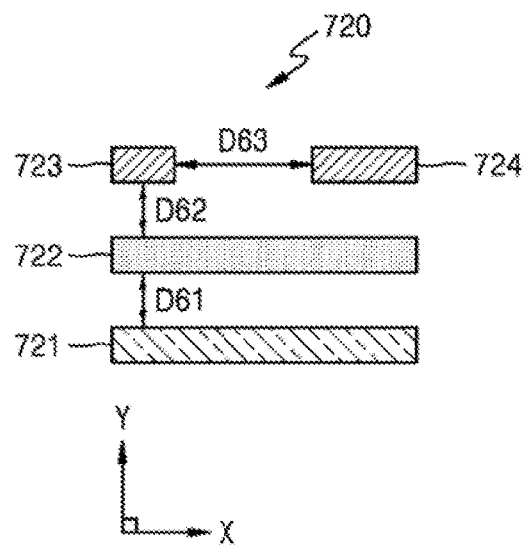
Figure 13C:
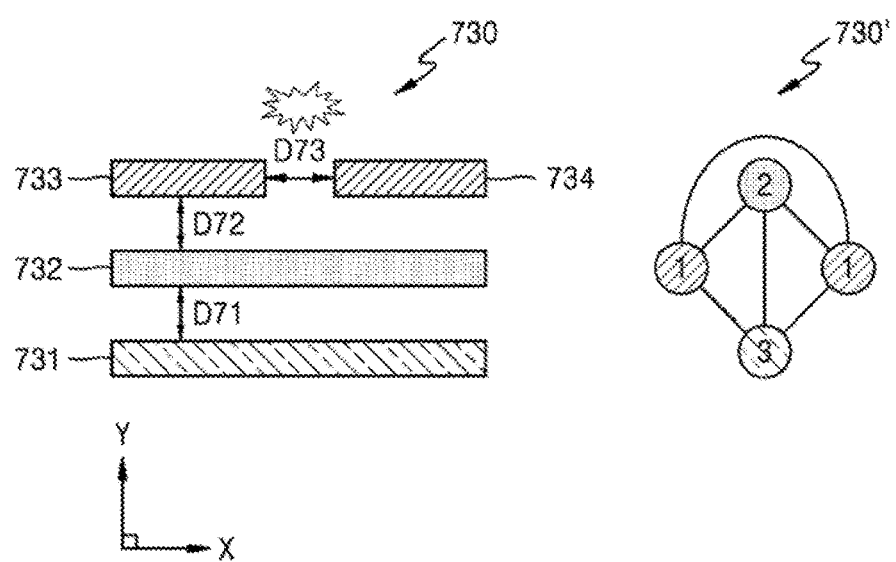

FIG. 13A through 13C show color violation check results with respect to patterns included in a unidirectional layer according to an exemplary embodiment of the present inventive concept.

Referring to FIG. 13A, an integrated circuit 710 may be generated by performing the colorless routing based on the space constraints illustrated in FIG. 12, and may include first through fourth patterns 711 through 714. The S2S spaces D51 through D53 between the first through fourth patterns 711 through 714 may be substantially equal to or greater than the first different color space DS1, and thus, may satisfy the first space constraint. Accordingly, in a color graph 710' based on the integrated circuit 710, a color violation may not be indicated.

Referring to FIG. 13B, an integrated circuit 720 may be generated by performing the colorless routing based on the space constraints illustrated in FIG. 12, and may include first through fourth patterns 721 through 724. The S2S spaces D61 and D62 between the first through fourth patterns 721 through 724 may be substantially equal to or greater than the first different color space DS1, and thus, may satisfy the first space constraint. The T2T space D63 between the third and fourth patterns 723 and 724 may be substantially equal to or greater than the second same color space SS2, and thus, may satisfy the second space constraint.

Referring to FIG. 13C, an integrated circuit 730 may correspond to a case in which the colorless routing based on the space constraints illustrated in FIG. 12 may not be performed, and may include first through fourth patterns 731 through 734. The S2S spaces D71 and D72 between the first through fourth patterns 731 through 734 may be substantially equal to or greater than the first different color space DS1, and thus, may satisfy the first space constraint. The T2T space D73 between the third and fourth patterns 733 and 734 may be less than the second same color space SS2. Here, the same color is assigned to the third and fourth patterns 733 and 734, and a color violation may occur between the third and fourth patterns 733 and 734. Accordingly, in a color graph 730' based on the integrated circuit 730, the color violation may be indicated between the patterns to which the first color is assigned. However, according to an exemplary embodiment illustrated in FIG. 12, the second space constraint constrains the T2T space so as to have the T2T be substantially equal to or greater than the second same color space SS2, and the color violation illustrated in FIG. 13C may not occur.

Figure 14:
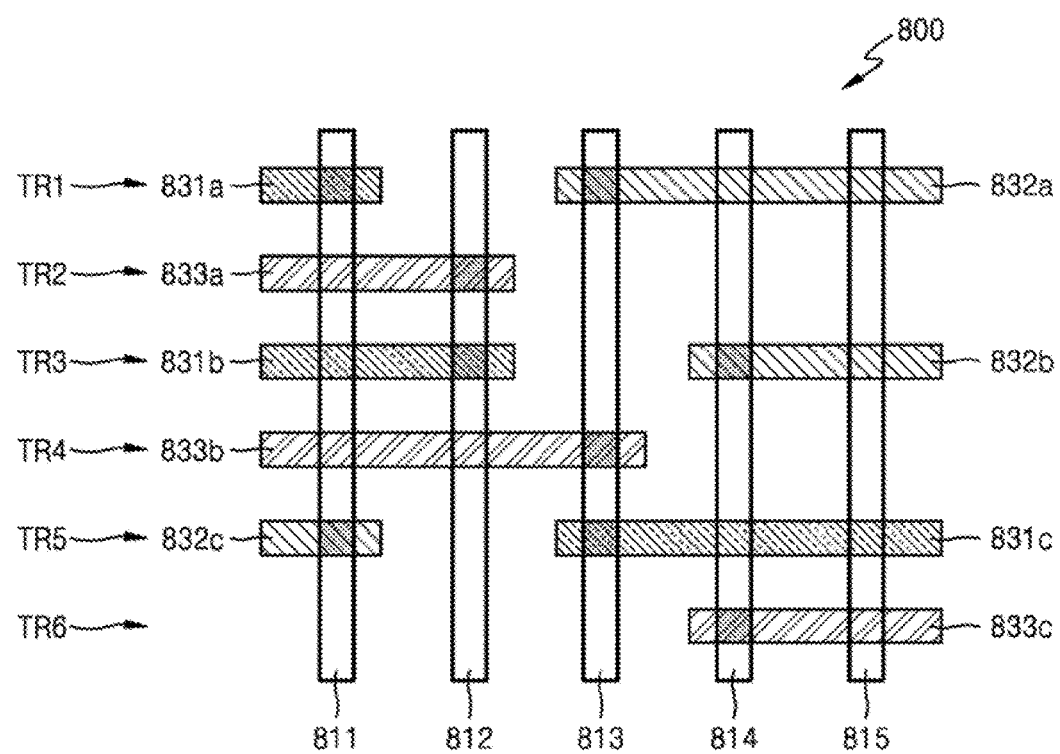
FIG. 14 shows an example of a layout generated by a color decomposition with respect to a TPL layer, according to an exemplary embodiment of the present inventive concept.

FIG. 14 illustrates an example of the layout 800 generated by color decomposition with respect to the TPL layer according to an exemplary embodiment of the present inventive concept.

Referring to FIG. 14, the layout 800 may include a first metal layer Ma including a plurality of first metal patterns 811 through 815, first vias V1 on the first metal layer Ma, and a second metal layer Mb including a plurality of second metal patterns 831a through 833c on the first vias V1. The first metal patterns 811 through 815 may extend in the second direction (for example, the direction Y) and may be arranged in parallel with one another. The second metal patterns 831a through 833c may extend in the first direction (for example, the direction X). For example, the second metal layer Mb may correspond to the TPL layer to which the TPL is to be applied, and first through third colors C1 through C3 may be assigned to the second metal patterns 831a through 833c.

For example, the first color may be assigned to the second metal patterns 831a, 831b, and 831c respectively arranged on first, third, and fifth tracks TR1, TR3, and TR5, and the second color C2 may be assigned to the second metal patterns 832a, 832b, and 832c respectively arranged on the first, third, and fifth tracks TR1, TR3, and TR5. Also, the third color C3 may be assigned to the second metal patterns 833a, 833b, and 833c respectively arranged on second, fourth, and sixth tracks TR2, TR4, and TR6.

Figure 15:
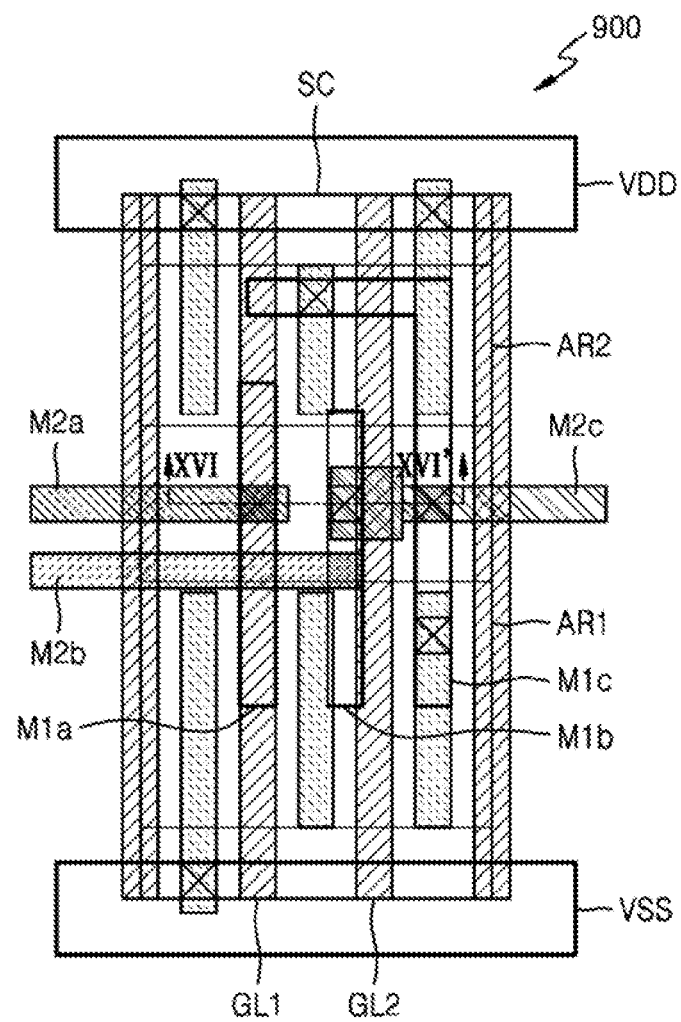
FIG. 15 is the layout of an integrated circuit according to an exemplary embodiment of the present inventive concept.

FIG. 15 is an integrated circuit layout 900 according to an exemplary embodiment of the present inventive concept.

Referring to FIG. 15, the integrated circuit layout 900 may include a standard cell SC. The standard cell SC may include first and second active regions AR1 and AR2, first and second gate lines GL1 and GL2, gate contacts CB, source/drain contacts CA, vias V0, and first through third lower patterns M1a through M1c.

The first and second active regions AR1 and AR2 may extend in the first direction (for example, the direction X), and may have different conductive types. The first and second active regions AR1 and AR2 may be referred to as diffusion regions. Here, a region between the first active region AR1 and the second active region AR2 may be referred to as a dummy region or a middle of line (MOL) region. A plurality of active pins extending in the second direction may be arranged in the first and second active regions AR1 and AR2, and at least one dummy pin extending in the second direction may be arranged in the dummy region. For example, the active pins arranged in the first active region AR1 may be included in an n-channel metal oxide semiconductor (NMOS) transistor, and the active pins arranged in the second active region AR2 may be included in a p-channel metal oxide semiconductor (PMOS) transistor. The source/drain contacts CA may be arranged in the first and second active regions AR1 and AR2, and may extend in the second direction. In one exemplary embodiment, each source/drain contact CA may be arranged between two adjacent gate lines GL. Here, the source/drain contacts CA may correspond to source/drain contacts of a semiconductor device.

The first and second gate lines GL1 and GL2 may extend in the second direction across the first and second active regions AR1 and AR2, and may be arranged in parallel to each other along the first direction. The first and second gate lines GL1 and GL2 may correspond to gate electrodes of the semiconductor device. The gate contacts CB may be arranged between the first active region AR1 and the second active region AR2. In one exemplary embodiment, the gate contacts CB may be arranged on the first and second gate lines GL1 and GL2. Here, the gate contacts CB may correspond to gate contacts of the semiconductor device. The vias V0 may be arranged on the gate contacts CB, respectively.

The integrated circuit layout 900 may be generated by performing routing that arranges vias V1 and first through third upper patterns M2a through M2c on the first through third lower patterns M1a through M1c included in the standard cell SC. The vias V1 may be arranged on the first through third lower patterns M1a through M1c, respectively. The first through third upper patterns M2a through M2c may be arranged on the vias V1, respectively. According to an exemplary embodiment of the present inventive concept, the first through third upper patterns M2a through M2c may be arranged to satisfy space constraints included in a technology file.

Figure 16:
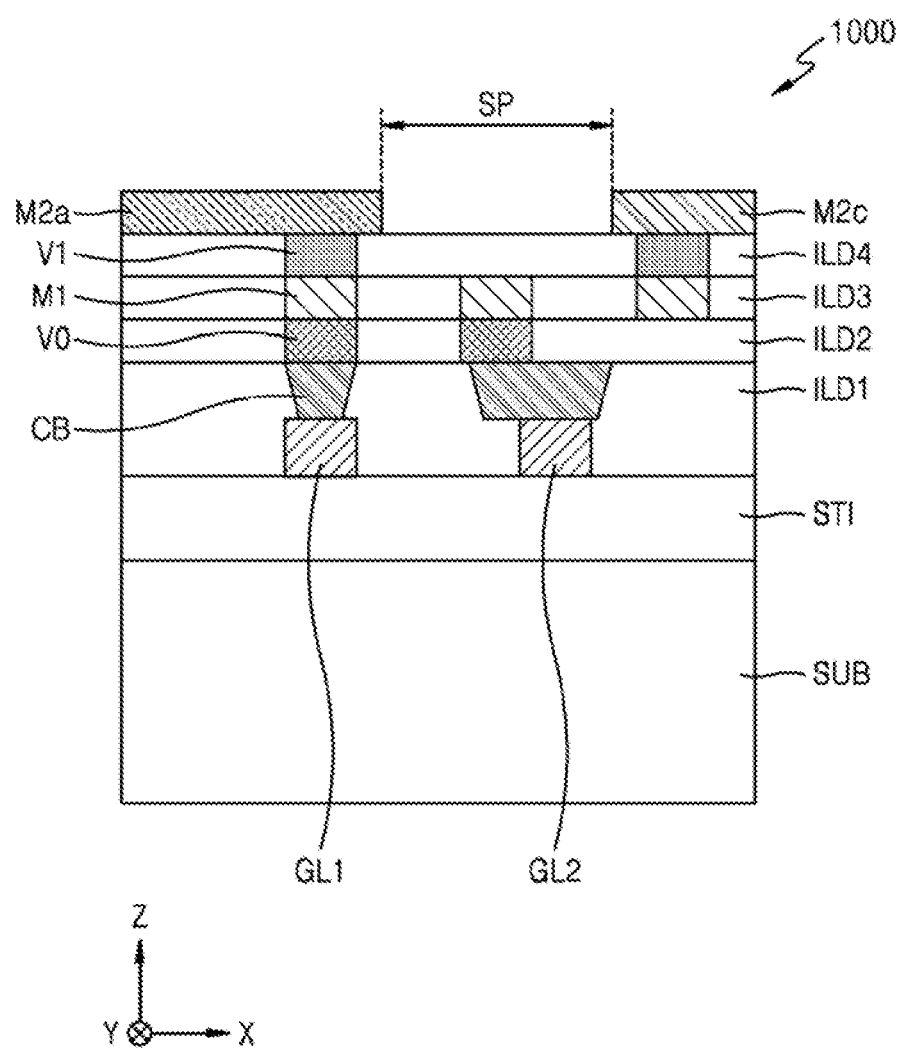
FIG. 16 is a cross-sectional view taken along a line XVI-XVI' of FIG. 15 according to an exemplary embodiment of the present inventive concept.

FIG. 16 is a cross-sectional view taken along a line XVI-XVI' of FIG. 15 according to an exemplary embodiment of the present inventive concept. A semiconductor device 1000 illustrated in FIG. 16 may be an example of a semiconductor device manufactured according to the integrated circuit layout 900 of FIG. 15.

Referring to FIG. 16, a substrate SUB may be a semiconductor substrate. For example, the semiconductor substrate may be any one of a silicon-on-insulator (SOI) substrate, silicon-on-sapphire, germanium, silicon-germanium, and gallium-arsenide. A device separation layer ST1 may be arranged on the substrate SUB and a first insulating layer ILD1 may be arranged on the device separation layer STL. The first insulating layer ILD1 may include an insulating material. For example, the insulating material may include any one of an oxide layer, a nitride layer, or an oxynitride layer.

The first and second gate lines GL1 and GL2 may be arranged on the device separation layer ST1. The first and second gate lines GL1 and GL2 may include, for example, a metal material, such as tungsten (W) or tantalum (Ta), a nitride thereof, a silicide thereof, doped polysilicon, or the like. For example, the first and second gate lines GL1 and GL2 may be formed by using the deposition process. The gate contacts CB may be arranged on the first and second gate lines GL1 and GL2, respectively, and the vias V0 may be arranged on the gate contacts CB, respectively. The gate contacts CB and the vias V0 may include, for example, a material having electrical conductivity, such as tungsten (W). The vias V1 may be arranged on a third insulating layer ILD3 and a lower layer M1. The first and third upper patterns M2a and M2c may be arranged on a fourth insulating layer ILD4 and vias V1. According to an exemplary embodiment, an upper layer including the first and third upper patterns M2a and M2c may be implemented as a bi-directional layer. Here, a space SP between the first and third upper patterns M2a and M2c may be substantially equal to or greater than the second same color space SS2. According to an exemplary embodiment of the present inventive concept, the upper layer may be implemented as a uni-directional layer. Here, a space SP between the first and third upper patterns M2a and M2c may be substantially equal to or greater than the second same color space SS2.

Figure 17:
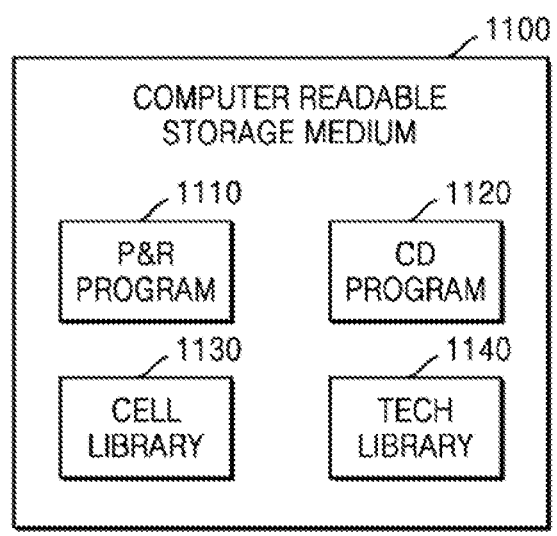
FIG. 17 shows a computer-readable storage medium according to an exemplary embodiment of the present inventive concept.

FIG. 17 illustrates a computer-readable storage medium 1100 according to an exemplary embodiment of the present inventive concept. Referring to FIG. 17, the storage medium 1100 may store a P&R program 1110, a color decomposition program 1120, a cell library 1130, and a technology library 1140.

The P&R program 1110 may include a plurality of instructions for performing the methods of generating the layout of the integrated circuit according to one or more exemplary embodiments. For example, the P&R program 1110 may be used to perform operations S100 and S120 of FIG. 1, and operations S200 and S220 of FIGS. 6 and 9. The color decomposition program 1120 may include a plurality of instructions for performing a color decomposition operation. For example, the color decomposition program 1120 may be used to perform operation S140 of FIG. 1, and operation S230 of FIG. 9.

The cell library 1130 may be a standard cell library and may include information about a standard cell, which is a unit for forming an integrated circuit. According to an exemplary embodiment, the information about the standard cell may include layout information necessary to generate the layout. According to an exemplary embodiment, the information about the standard cell may include timing information necessary for verification or simulation of the layout. The technology library 1140 may store a plurality of technology files. According to an exemplary embodiment, each of the technology files may include space constraints between TPL layer patterns.

While the inventive concept has been particularly shown and described with reference to embodiments thereof, it will be understood that various changes in form and details may be made therein without departing from the spirit and scope of the following claims. Various features of the above described and other embodiments can be mixed and matched in any manner, to produce further embodiments consistent with the invention as claimed herein.

What is claimed is:

1. A computer-implemented method, the method comprising:
   placing standard cells based on design data defining an integrated circuit;
   generating a layout of the integrated circuit by performing colorless routing wherein a first pattern, a second pattern and a third pattern included in a triple patterning lithography (TPL) layer are arranged, based on space constraints corresponding to a plurality of predetermined definitions, on the placed standard cells, wherein each predetermined definition depends on a specific positional relationship of adjacent patterns, identities of colors to be respectively assigned to adjacent patterns and a minimum space between adjacent patters, wherein the positional relationships include one of adjacent patterns disposed in a same track, adjacent patterns disposed in parallel, or adjacent patterns perpendicularly disposed;
   storing the generated layout to a non-transitory computer-readable storage medium;
   generating a first mask, a second mask, and a third mask based on the layout; and
   manufacturing a semiconductor device by using the generated first mask, the second mask, and the third mask,
   wherein the space constraints define minimum spaces between the first pattern, the second pattern, and the third pattern, and a color violation is determined based on the space constraints.

2. The method of claim 1, further comprising, assigning a first color, a second color, and a third color to the first pattern, the second pattern, and the third pattern, respectively, wherein the first color, the second color, and the third color respectively correspond to the first mask, the second mask, and the third mask.

3. The method of claim 1, wherein the generating the layout comprises receiving a technology file including the space constraints, and performing the colorless routing based on the received technology tile.

4. The method of claim 1, further comprising performing color decomposition with respect to TPL layer patterns.

5. The method of claim 4, wherein the performing color decomposition comprises assigning different colors to the first pattern, the second pattern, and the third pattern when a space between the first pattern, the second pattern, and the third pattern is less than a minimum space between patterns with same colors.

6. The method of claim 4, wherein the performing color decomposition comprises assigning same colors to the first pattern, the second pattern, and the third pattern when a space between the first pattern, the second pattern, and the third pattern is equal to or greater than a minimum space between patterns with different colors.

7. The method of claim 1, wherein the first pattern and the second pattern extend in a first direction and are adjacent to each other in a second direction which is perpendicular to the first direction, and the space constraints comprise a first space constraint that defines a minimum space between the first pattern and the second pattern as a first space between patterns to which different colors are assigned.

8. The method of claim 7, wherein the first space is a minimum side-to-side space between the patterns to which different colors are assigned.

9. The method of claim 7, wherein the third pattern extends in the first direction and is adjacent to the first pattern or the second pattern in the first direction, and the space constraints further comprise a second space constraint that defines a minimum space between the third pattern and the first pattern or the second pattern as a second space between patterns to which a same color is assigned.

10. The method of claim 9, wherein the second space is a minimum tip-to-tip space between patterns to which a same color is assigned.

11. The method of claim 7, wherein the TPL layer TPL layer is a bi-directional layer, the third pattern extends in the second direction and is adjacent to the first pattern or the second pattern in the first direction, and the space constraints comprise a third space constraint that defines a minimum tip-to-side space between the third pattern and the first pattern or the second pattern as a minimum tip-to-side space between patterns to which a same color is assigned.

12. The method of claim 11, wherein the space constraints further comprise a fourth space constraint that defines a minimum corner-to-corner space between the third pattern and the first pattern or the second pattern as a minimum corner-to-corner space between the patterns to which a same color is assigned.

13. The method of claim 7, wherein the TPL layer is a uni-directional layer, the third pattern extends in the first direction and is adjacent to the first pattern or the second pattern in the first direction, and the space constraints further comprise a third space constraint that defines a minimum corner-to-corner space between the first pattern, the second pattern, and the third pattern as a minimum corner-to-corner space between patterns to which different colors are assigned.

14. An integrated circuit comprising: a layer including a first pattern, a second pattern, and a third pattern to which a first color, a second color, and a third color are respectively assigned, wherein the first pattern and the second pattern extend in a first direction and are adjacent to each other in a second direction which is perpendicular to the first direction, and a space between the first pattern and the second pattern is equal to or greater than a minimum side-to-side space between patterns to which different colors are assigned.

15. The integrated circuit of claim 14, wherein the third pattern extends in the first direction and is adjacent to the first pattern or the second pattern in the first direction, and a space between the third pattern and the first pattern or the second pattern is equal to or greater than a minimum tip-to-tip space between patterns to which a same color is assigned.

16. The integrated circuit of claim 14, wherein the layer is a bi-directional layer, the third pattern extends in the second direction and is adjacent to the first pattern or the second pattern in the first direction, a tip-to-side space between the third pattern and the first pattern or the second pattern is equal to or greater than a minimum tip-to-side space between patterns to which a same color is assigned, and a corner-to-corner space between the third pattern and the first pattern or the second pattern is equal to or greater than a minimum corner-to-corner space between patterns to which a same color is assigned.

17. The integrated circuit of claim 14, wherein the layer is a unidirectional layer, the third pattern extends in the first direction and is adjacent to the first pattern or the second pattern in the first direction, and a corner-to-corner space between the first pattern, the second, and the third pattern is equal to or greater than a minimum corner-to-corner space between patterns to which different colors are assigned.

18. The integrated circuit of claim 14, further comprising a plurality of standard cells, wherein each standard cell of the plurality of standard cells comprises: a first active region and a second active region having different conductive types and extending in the first direction, and a plurality of gate lines extending in the second direction across the first active region and the second active region and arranged in parallel with one another, wherein the layer corresponds to a wiring layer arranged on the plurality of gate lines to apply an electrical signal to the plurality of gate lines.

19. A computer-implemented method, the method comprising:
placing standard cells based on design data defining an integrated circuit;
generating a layout of the integrated circuit by performing colorless routing wherein a first pattern, a second pattern, and a third pattern included in a triple patterning lithography (TPL) layer are arranged on the placed standard cells according to predefined space constraints, wherein the predefined space constraints include a relative positional relationship between adjacent patterns, the identity of colors to be respectively assigned to the adjacent patterns, and a minimum space between two of the first pattern, the second pattern, and the third pattern,
wherein the positional relationships include one of adjacent patterns disposed in a same track, adjacent patterns disposed in parallel, or adjacent patterns perpendicularly disposed, and
wherein when a space between two of the first pattern, the second pattern, and the third pattern is less than respective space constraint, a color violation is indicated;
storing the generated layout to a non-transitory computer-readable storage medium;
assigning a first color, a second color, and a third color to the first pattern, the second pattern, and a third pattern, respectively
generating a first mask, a second mask, and a third mask respectively corresponding to the first color, the second color, and the third color based on the layout; and
manufacturing a semiconductor device by using the generated first mask, the second mask, and the third mask.

20. The method of claim 19, wherein performing colorless routing comprises generating the layout without the performing color decomposition.

* * * * *